US012198669B2

(12) United States Patent
Liu et al.

(10) Patent No.: US 12,198,669 B2
(45) Date of Patent: Jan. 14, 2025

(54) SYSTEMS AND METHODS FOR REDUCING NOISE IN IMAGING SYSTEM

(71) Applicant: SHANGHAI UNITED IMAGING HEALTHCARE CO., LTD., Shanghai (CN)

(72) Inventors: Zhenbao Liu, Shanghai (CN); Xiaolei Guan, Shanghai (CN); Haiyun Hou, Shanghai (CN); Xiaopeng Luo, Shanghai (CN); Mingchao Wang, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 1021 days.

(21) Appl. No.: 17/137,462

(22) Filed: Dec. 30, 2020

(65) Prior Publication Data
US 2021/0196222 A1    Jul. 1, 2021

(30) Foreign Application Priority Data

Dec. 30, 2019  (CN) .......................... 201911400208.1
Mar. 31, 2020  (CN) .......................... 202010245912.0

(51) Int. Cl.
*G01R 33/28* (2006.01)
*A61B 6/00* (2024.01)
(Continued)

(52) U.S. Cl.
CPC ........ *G10K 11/17837* (2018.01); *G01R 33/28* (2013.01); *G01R 33/288* (2013.01);
(Continued)

(58) Field of Classification Search
CPC ........... A61B 6/00; A61B 6/04; A61B 6/5258; A61B 6/547; G01R 33/28; G01R 33/283;
(Continued)

(56) References Cited

U.S. PATENT DOCUMENTS 5,481,192 A * 1/1996 Mehlkopf .......... G01R 33/3854
                                              324/318
5,546,075 A    8/1996 Shimoji
(Continued)

FOREIGN PATENT DOCUMENTS

CN        2168315 Y     6/1994
CN      103198838 A     7/2013
(Continued)

OTHER PUBLICATIONS

Zhu, Leqing et al., Automatic Acoustical Identification of Insects Based on MFCC and VQ, Acta Entomologica Sinica, 53(8): 901-907, 2010.
(Continued)

*Primary Examiner* — Harry S Hong
(74) *Attorney, Agent, or Firm* — METIS IP LLC

(57) ABSTRACT

The present disclosure relates to systems and methods for reducing noise in an imaging system. The methods may include determining an imaging sequence for imaging a subject. When imaging the subject based at least on the imaging sequence, the imaging system may generate a first noise. The methods may further include obtaining, based on the imaging sequence, noise reduction data from a database. And the method may also include causing a generation device to produce a second noise based on the noise reduction data. The second noise may be configured to interfere with the first noise to reduce the first noise.

20 Claims, 19 Drawing Sheets

(51) Int. Cl.
*A61B 6/04* (2006.01)
*G10K 11/178* (2006.01)
*G01R 33/385* (2006.01)

(52) U.S. Cl.
CPC ...... *G10K 11/17821* (2018.01); *G01R 33/283* (2013.01); *G01R 33/3854* (2013.01); *G10K 2210/1161* (2013.01)

(58) Field of Classification Search
CPC .... G01R 33/288; G01R 33/3854; G06N 3/04; G06N 3/0454; G10K 11/17821; G10K 11/17837; G10K 2210/1161
USPC .................................................. 381/71.1, 71.3
See application file for complete search history.

(56) References Cited

U.S. PATENT DOCUMENTS

| | | | |
|---|---|---|---|
| 2007/0228279 | A1 | 10/2007 | Matsumoto et al. |
| 2009/0081986 | A1 | 3/2009 | Traylor |
| 2009/0170550 | A1 | 7/2009 | Foley |
| 2012/0057711 | A1 | 3/2012 | Makino et al. |
| 2013/0154647 | A1* | 6/2013 | Yang ............... G01R 33/283 324/318 |
| 2013/0262115 | A1 | 10/2013 | Chuang |
| 2014/0067382 | A1 | 3/2014 | Ho et al. |
| 2014/0086421 | A1* | 3/2014 | Kang ............... G01R 33/288 381/57 |
| 2014/0311499 | A1* | 10/2014 | Lee ................. G10K 11/17861 128/866 |
| 2015/0042333 | A1* | 2/2015 | Grodzki ............ G01R 33/288 324/309 |
| 2016/0284338 | A1* | 9/2016 | Goto ............... G10K 11/17853 |
| 2017/0192068 | A1* | 7/2017 | Taniguchi ......... G01R 33/3854 |
| 2017/0251102 | A1 | 8/2017 | Hodge |
| 2018/0246526 | A1 | 8/2018 | Wilkinson et al. |
| 2024/0019513 | A1* | 1/2024 | Weingärtner ......... G06N 3/096 |

FOREIGN PATENT DOCUMENTS

| | | | | |
|---|---|---|---|---|
| CN | 203750048 | U | 8/2014 | |
| CN | 203771602 | U | 8/2014 | |
| CN | 105455384 | A | 4/2016 | |
| CN | 106275322 | A | 1/2017 | |
| CN | 106443531 | A | 2/2017 | |
| CN | 206299429 | U | 7/2017 | |
| CN | 107527617 | A | 12/2017 | |
| CN | 107550505 | A | 1/2018 | |
| CN | 108495227 | A | 9/2018 | |
| CN | 108900943 | A | 11/2018 | |
| CN | 208079335 | U | 11/2018 | |
| CN | 109065014 | A | 12/2018 | |
| CN | 109697972 | A | 4/2019 | |
| CN | 208973206 | U | 6/2019 | |
| CN | 209281567 | U | 8/2019 | |
| CN | 110762728 | A | 2/2020 | |
| DE | 102016014320 | A1 | 5/2017 | |
| EP | 3771918 | A1 * | 2/2021 | ......... G01R 33/3854 |
| JP | H08115089 | A | 5/1996 | |
| JP | 2000336994 | A | 12/2000 | |
| JP | 2006011109 | A | 1/2006 | |
| TW | 202011750 | A | 3/2020 | |

OTHER PUBLICATIONS

Chen, Heming et al., Configuration Simulation Design of Active Room Noise Elimination Device, Science & Technology Information, 2019, 3 pages.

Martin Bouchard et al., Inverse Structure for Active Noise Control and Combined Active Noise Control/Sound Reproduction Systems, IEEE Transactions on Speech and Audio Processing, 9(2): 141-151, 2001.

First Office Action in Chinese Application No. 201911400208.1 mailed on Jun. 6, 2022, 22 pages.

\* cited by examiner

SYSTEMS AND METHODS FOR REDUCING NOISE IN IMAGING SYSTEM

CROSS-REFERENCE TO RELATED APPLICATION

This application claims priority of Chinese Patent Application No. 201911400208.1, filed on Dec. 30, 2019, and Chinese Patent Application No. 2020102459120, filed on Mar. 31, 2020, the contents of each of which are hereby incorporated by reference in their entireties.

TECHNICAL FIELD

The present disclosure generally relates to imaging technology, and more particularly, to systems and methods for reducing noise in an imaging system.

BACKGROUND

Medical imaging systems may generate noise when imaging a subject. For example, a magnetic resonance imaging (MRI) system may generate, using a magnet, a magnetic field in which nuclei of the subject may generate magnetic resonance (MR) signals. The MR signals may be further reconstructed and imaged. Components of the MRI system may be mechanically strained under electromagnetic forces generated by the magnet, thereby generating noise. The noise may bring a mental burden to the subject (e.g., a patient). Furthermore, in the presence of large noise, when an emergency occurs during the imaging process, it may be difficult to timely detect an alarm provided by the subject through an audio intercom. Therefore, it is desirable to provide effective systems and methods for reducing noise and/or generating alarms.

SUMMARY

According to an aspect of the present disclosure, a method for reducing noise in an imaging system is provided. The method may be implemented on a computing device having at least one storage device storing a set of instructions, and at least one processor in communication with the at least one storage device. The method may include determining an imaging sequence for imaging a subject. When imaging the subject based at least on the imaging sequence, the imaging system may generate a first noise. The method may further include obtaining, based on the imaging sequence, noise reduction data from a database. And the method may further include causing a generation device to produce a second noise based on the noise reduction data. The second noise may be configured to interfere with the first noise to reduce the first noise.

In some embodiments, the obtaining, based on the imaging sequence, noise reduction data from a database may include generating a trigger signal based on the imaging sequence.

In some embodiments, the database may be generated based on historical first noise corresponding to a plurality of imaging sequences.

In some embodiments, to generate the database, the method may further include for each of the plurality of imaging sequences, collecting the historical first noise generated by the imaging system when imaging the subject based at least on the imaging sequence; obtaining parameters relating to the historical first noise; and generating historical noise reduction data based on the parameters. And the method may further include generating the database based on the historical noise reduction data corresponding to the plurality of imaging sequences.

In some embodiments, the method may further include modifying the database based on first modification noises corresponding to the plurality of imaging sequences.

In some embodiments, the modifying the database based on the first modification noise corresponding to the plurality of imaging sequences may include for at least one of the plurality of imaging sequences, collecting the first modification noise generated by the imaging system when imaging the subject based at least on the imaging sequence; obtaining parameters relating to the first modification noise; and generating modification data based on the parameters. The modification data may include noise reduction data for reducing the first modification noise. And the modifying the database based on the first modification noise corresponding to the plurality of imaging sequences may further include modifying the database based on the modification data corresponding to the at least one of the plurality of imaging sequences.

In some embodiments, the at least one processor may include a field programmable gate array or an advanced RISC machine. A clock of the field programmable gate array or the advanced RISC machine may be configured to generate a clock signal with a frequency different from an operating frequency of the imaging system.

In some embodiments, the generation device may include a headset.

In some embodiments, a position of the generation device may be adjustable based at least on a position of the subject in the imaging system.

In some embodiments, the noise reduction data may be adjustable based at least on a position of the subject in the imaging system or a position of the generation device.

According to another aspect of the present disclosure, an alarm method is provided. The method may be implemented on a computing device having at least one storage device storing a set of instructions, and at least one processor in communication with the at least one storage device. The method may include collecting sound signals in a target time period. The method may further include determining whether the sound signals contain target feature information. The target feature information may relate to target sound signals generated by a sound assembly. The method may further include in response to determining that the sound signals contain the target feature information, generating alarm information; and causing an alarm assembly to generate an alarm signal based on the alarm information.

In some embodiments, the determining whether the sound signals contain the target feature information may include extracting feature information from the sound signals; and determining whether the feature information contains the target feature information based on a recognition algorithm.

In some embodiments, the feature information may include a spectrum, a cepstrum, a formant, a fundamental tone, a reflection coefficient of the sound signals, or the like, or any combination thereof.

In some embodiments, the recognition algorithm may include a template matching algorithm, a nearest neighbor algorithm, a neural network algorithm, a hidden Markov model algorithm, or the like, or any combination thereof.

In some embodiments, the method may further include reducing noise in the sound signals.

In some embodiments, the reducing noise in the sound signals may include dividing the sound signals into a plurality of frames; for each of the plurality of frames; extracting the feature information from the frame; determining whether the feature information is the same as feature information of one or more previous frames; in response to determining that the feature information is the same as the feature information of the one or more previous frames, determining the frame as a noise frame; and reducing noise in the sound signals based on the noise frame.

In some embodiments, the reducing noise in the sound signals may further include determining an imaging sequence used by an imaging system for imaging a subject in the target time period. The imaging system may generate first noise when imaging the subject based at least on the imaging sequence. The reducing noise in the sound signals may further include generating a trigger signal based on the imaging sequence; obtaining, based on the trigger signal, noise reduction data from a database; and causing a generation device to produce a second noise based on the noise reduction data. The second noise may interfere with the first noise to reduce the first noise. And the sound signals may include the first noise, the second noise, and the target sound signals.

According to a further aspect of the present disclosure, an alarm device is provided. The alarm device may include a sound assembly, a recognition assembly, and an alarm assembly. The sound assembly may be configured to generate target sound signals including target feature information. The recognition assembly may be configured to obtain sound signals; determine whether the sound signals contain the target feature information; and in response to determining that the sound signals contain the target feature information, generate alarm information. And the alarm assembly may be configured to generate an alarm signal based on the alarm information.

In some embodiments, the sound assembly may include a deformable housing with a through hole and a whistle core provided on the deformable housing. The whistle core may communicate with the deformable housing through the through hole.

In some embodiments, the deformable housing may include a rubber ball including the through hole.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
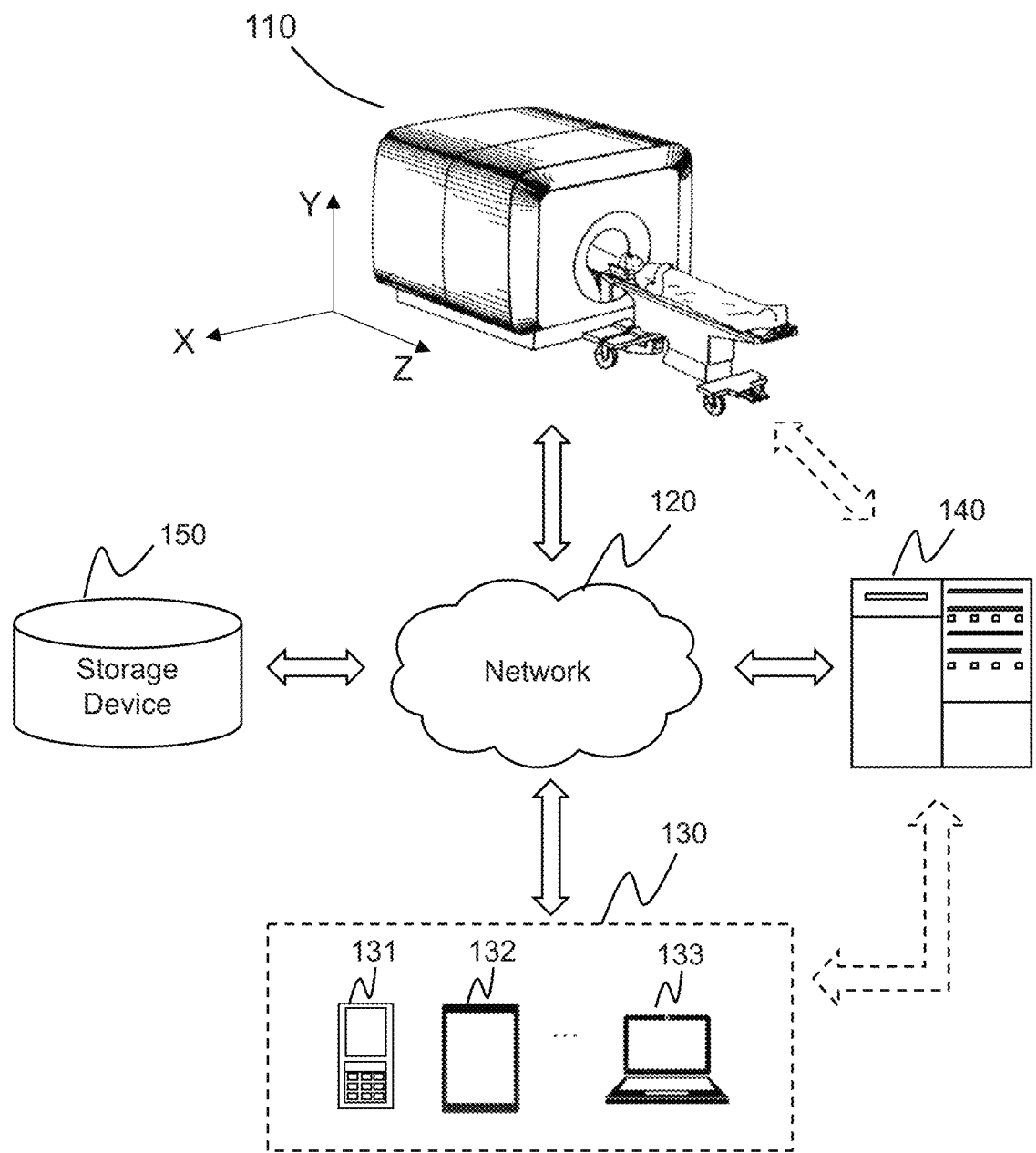
FIG. 1 is a schematic diagram illustrating an exemplary imaging system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is to describe particular example embodiments only and is not intended to be limiting. As used herein, the singular forms "a" "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, section or assembly of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., the processor 310 illustrated in FIG. 3 and/or the CPU 430 illustrated in FIG. 4) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, an engine, or a portion thereof.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

A noise reduction technology, such as an active noise reduction technology, may be mainly used in consumer electronic products, which may be not commonly used in medical products. In an active noise reduction process, an anti-phase noise may be generated as a feedback of a noise.

Compared with the noise, the anti-phase noise may have a certain delay, which may affect the noise reduction effect. Furthermore, the active noise reduction technologies currently used may be mainly applied to a small-range closed sound field, such as headphones. In an open sound field, such as a sound field relating to an imaging system (e.g., an MRI system), a distribution of the open sound field may be complex. Noises in the open sound field may have a wide frequency band, then only part of the noises may be collected, which may not characterize the distribution of the entire sound field. Therefore, the active noise reduction technology may not be effectively applied in the open sound field.

Moreover, if the noises generated by the imaging system when scanning a subject (e.g., a patient) is too large, it may be difficult to timely detect the alarm provided by the subject through an audio intercom when an emergency occurs. Therefore, it is desirable to provide effective systems and methods for reducing noise and/or generating alarms.

An aspect of the present disclosure relates to systems and methods for reducing noise in an imaging system. The systems may determine an imaging sequence for imaging a subject. When imaging the subject based at least on the imaging sequence, the imaging system may generate a first noise. The systems may obtain, based on the imaging sequence, noise reduction data from a database. The systems may further cause a generation device (e.g., a speaker) to produce a second noise based on the noise reduction data. The second noise may be configured to interfere with the first noise to reduce the first noise. According to the systems and methods of the present disclosure, the second noise may be determined from the database before or at the same time when the noise is generated, thereby reducing the first noise effectively.

Another aspect of the present disclosure relates to alarm systems and alarm methods. The systems may collect sound signals in a target time period. The systems may determine whether the sound signals contain target feature information (e.g., feature information relating to target sound signals generated by a sound assembly). In response to determining that the sound signals contain the target feature information, the systems may generate alarm information. The systems may further cause an alarm assembly to generate an alarm signal based on the alarm information. According to the systems and methods of the present disclosure, a subject (e.g., a patient) may provide an alarm using the sound assembly effectively without being disturbed by noise generated by the imaging system, thereby improving user experience during an imaging process.

FIG. 1 is a schematic diagram illustrating an exemplary imaging system 100 according to some embodiments of the present disclosure. As illustrated, the imaging system 100 may include an MRI scanner 110, a network 120, a terminal device 130, a processing device 140, and a storage device 150. The components of the imaging system 100 may be connected in one or more of various ways. Mere by way of example, as illustrated in FIG. 1, the MRI scanner 110 may be connected to the processing device 140 through the network 120. As another example, the MRI scanner 110 may be connected to the processing device 140 directly (as indicated by the bi-directional arrow in dotted lines linking the MRI scanner 110 and the processing device 140). As a further example, the storage device 150 may be connected to the processing device 140 directly or through the network 120. As a further example, the terminal device 130 may be connected to the processing device 140 directly (as indicated by the bi-directional arrow in dotted lines linking the terminal device 130 and the processing device 140) or through the network 120.

The MRI scanner 110 may scan a subject located within its detection region and generate data relating to the subject. In some embodiments, the subject may include a patient, a man-made object, etc. In some embodiments, the subject may include a specific portion, organ, and/or tissue of a patient. For example, the subject may include a head, a brain, a neck, a body, a shoulder, an arm, a thorax, a cardiac, a stomach, a blood vessel, a soft tissue, a knee, feet, or the like, or any combination thereof. In some embodiments, the MRI scanner 110 may be a close-bore scanner or an open-bore scanner. In the present disclosure, the X axis, the Y axis, and the Z axis shown in FIG. 1 may form an orthogonal coordinate system. The X axis and the Z axis shown in FIG. 1 may be horizontal and the Y axis may be vertical. As illustrated, the positive X direction along the X axis may be from the right side to the left side of the MRI scanner 110 seen from the direction facing the front of the MRI scanner 110, the positive Y direction along the Y axis may be from the lower part to the upper part of the MRI scanner 110, the positive Z direction along the Z axis may refer to a direction in which the subject is moved out of the scanning channel (or referred to as the bore) of the MRI scanner 110. More description of the MRI scanner 110 may be found elsewhere in the present disclosure (e.g., FIG. 2 and the description thereof). In the present disclosure, "subject" and "object" are used interchangeably.

The network 120 may include any suitable network that can facilitate the exchange of information and/or data for the imaging system 100. In some embodiments, one or more components of the imaging system 100 (e.g., the MRI scanner 110, the terminal device 130, the processing device 140, the storage device 150) may communicate with one or more other components of the imaging system 100 via the network 120. For example, the processing device 140 may obtain imaging data from the MRI scanner 110 via the network 120. As another example, the processing device 140 may obtain noise reduction data from a database stored in the storage device 150 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the imaging system 100 may be connected to the network 120 to exchange data and/or information.

The terminal device 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear; a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google™ Glass, an Oculus Rift a Hololens; a Gear VR, etc. In some embodiments, the MRI scanner 110 and/or the processing device 140 may be remotely operated through the terminal device 130. In some embodiments, the MRI scanner 110 and/or the processing device 140 may be operated through the terminal device 130 via a wireless connection. In some embodiments, the terminal device 130 may receive information and/or instructions inputted by a user, and send the received information and/or instructions to the MRI scanner 110 or the processing device 140 via the network 120. In some embodiments, the terminal device 130 may receive data and/or information from the processing device 140. In some embodiments, the terminal device 130 may be part of the processing device 140. In some embodiments, the terminal device 130 may be omitted.

The processing device 140 may process data and/or information obtained from the MRI scanner 110, the terminal device 130, and/or the storage device 150. For example, the processing device 140 may obtain noise reduction data from the storage device 150 and modify the noise reduction data. As another example, the processing device 140 may obtain sound signals from the MRI scanner 110 for further analysis (e.g., extracting feature information from the sound signals, determining whether the feature information contains target feature information, etc.). In some embodiments, the processing device 140 may be a single server or a server group. The server group may be centralized or distributed. In some embodiments, the processing device 140 may be local or remote. For example, the processing device 140 may access information and/or data stored in or acquired by the MRI scanner 110, the terminal device 130, and/or the storage device 150 via the network 120. As another example, the processing device 140 may be directly connected to the MRI scanner 110 (as illustrated by the bidirectional arrow in dashed lines connecting the processing device 140 and the MRI scanner 110 in FIG. 1), the terminal device 130 (as illustrated by the bidirectional arrow in dashed lines connecting the processing device 140 and the terminal device 130 in FIG. 1), and/or the storage device 150 to access stored or acquired information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented on a computing device 300 having one or more components illustrated in FIG. 3 in the present disclosure.

The storage device 150 may store data and/or instructions. In some embodiments, the storage device 150 may store data obtained from the MRI scanner 110, the terminal device 130, and/or the processing device 140. For example, the storage device 150 may store imaging sequences used by the MRI scanner 110 for imaging a subject. As another example, the storage device 150 may store a database including noise reduction data for noise reduction. In some embodiments, the storage device 150 may store data and/or instructions that the processing device 140 may execute or use to perform exemplary methods described in the present disclosure. For example, the storage device 150 may store instructions that the processing device 140 may execute to reconstruct a magnetic resonance image. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components (e.g., the MRI scanner 110, the processing device 140, the terminal device 130) of the imaging system 100. One or more components of the imaging system 100 may access the data or instructions stored in the storage device 150 via the network 120. In some embodiments, the storage device 150 may be directly connected to or communicate with one or more components (e.g., the MRI scanner 110, the processing device 140, the terminal device 130) of the imaging system 100. In some embodiments, the storage device 150 may be part of the processing device 140.

In some embodiments, the imaging system 100 may further include one or more power supplies (not shown in FIG. 1) connected to one or more components (e.g., the MRI scanner 110, the processing device 140, the terminal device 130, the storage device 150) of the imaging system 100.

In some embodiments, the imaging system 100 may further include an alarm device (not shown in FIG. 1). The subject (e.g., a patient scanned by the MRI scanner 110) may provide, using the alarm device, an alarm signal to an operator of the MRI scanner 110. For example, the alarm device may include a sound assembly, a recognition assembly, an alarm assembly, etc. The subject may control the sound assembly to generate target sound signals including target feature information. The recognition assembly may be configured to obtain sound signals (e.g., sound signals in and/or out of the MRI scanner 110) and determine whether the sound signals contain the target feature information. In response to determining that the sound signals contain the target feature information, the recognition assembly may generate alarm information. Further, the alarm assembly may generate an alarm signal based on the alarm information. In some embodiments, the alarm device may be integrated in the MRI scanner 110 as a component thereof. In some embodiments, the alarm device may also be provided as a separate device communicating with one or more components (e.g., the MRI scanner 110, the processing device 140, the terminal device 130) of the imaging system 100 via the network 120. More description of the alarm device may be found elsewhere in the present disclosure (e.g., FIG. 10, FIG. 11, and the descriptions thereof).

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 2:
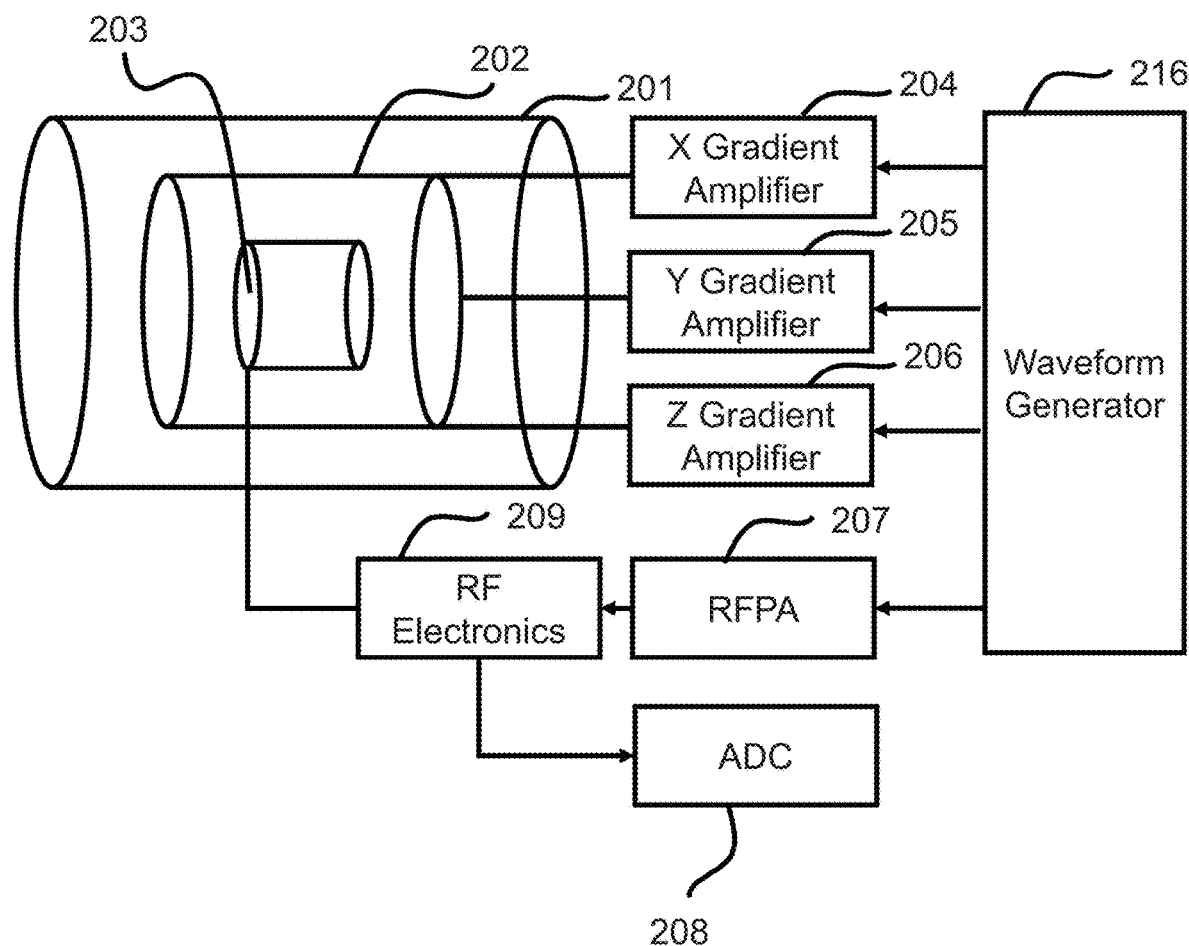
FIG. 2 is a schematic diagram illustrating an exemplary MRI scanner according to some embodiments of the present disclosure.

FIG. 2 is a schematic diagram illustrating an exemplary MRI scanner according to some embodiments of the present disclosure. As illustrated, a main magnet 201 may generate a first magnetic field (also referred to as a "main magnetic field") that may be applied to a subject exposed inside the field. The main magnet 201 may include a resistive magnet or a superconductive magnet that both need a power supply (not shown) for operation. Alternatively, the main magnet 201 may include a permanent magnet. The main magnet 201 may include a bore that the subject is placed within. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. The gradient coils 202 may generate a second magnetic field (also referred to as a "gradient field", including gradient fields Gx, Gy, and Gz). The second magnetic field may be superimposed on the main field generated by the main magnet 201 and distort the main field so that the magnetic orientations of the protons of a subject may vary as a function of their positions inside the gradient field, thereby encoding spatial information into MR signals related to the region of the subject being imaged. The gradient coils 202 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of MR signals for image construction. The gradient coils 202 may be connected with one or more of an X gradient amplifier 204, a Y gradient amplifier 205, or a Z gradient amplifier 206. One or more of the three amplifiers may be connected to a waveform generator 216.

The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 2 are the same as or similar to those described in FIG. 1.

In some embodiments, radio frequency (RF) coils 203 may be located inside the main magnet 201 and serve as transmitters, receivers, or both. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RE coils 203 may generate RF signals that is utilized to generate MR signals related to the region of the subject being imaged. The RF signals may be perpendicular to the main magnetic field. The waveform generator 216 may generate an RF pulse. The RF pulse may be amplified by the RFPA 207, processed by the RF electronics 209, and applied to the RF coils 203 to generate the RF signals in response to a powerful current generated by the RF electronics 209 based on the amplified RF pulse.

When used as receivers, the RE coils may be responsible for detecting MR signals (e.g., echoes). After excitation, the MR signals generated by the subject may be sensed by the RE coils 203. The receive amplifier then may receive the sensed MR signals from the RE coils 203, amplify the sensed MR signals, and provide the amplified MR signals to the ADC 208. The ADC 208 may transform the MR signals from analog signals to digital signals. The digital MR signals then may be sent to the processing device 140 for sampling.

In some embodiments, the gradient coils 202 and the RE coils 203 may be circumferentially positioned with respect to the subject. It is understood by those skilled in the art that the main magnet 201, the gradient coils 202, and the RF coils 203 may be situated in a variety of configurations around the subject.

In some embodiments, the RFPA 207 may amplify an RF pulse (e.g., the power of the RF pulse, the voltage of the RF pulse) such that an amplified RE pulse is generated to drive the RE coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA, or a nonlinear RFPA. In some embodiments, the RFPA 207 may include one or more RFPAs.

In some embodiments, the MRI scanner 110 may further include a subject positioning system (not shown). The subject positioning system may include a subject cradle and a transport device. The subject may be placed on the subject cradle and be positioned by the transport device within the bore of the main magnet 201.

MRI systems (e.g., the imaging system 100 in the present disclosure) may be commonly used to obtain an interior image from a patient for a particular region of interest that can be used for the purposes of, for example, diagnosis, treatment, or the like, or a combination thereof. The MRI systems may include a main magnet (e.g., the main magnet 201) assembly for providing a strong uniform main magnetic field to align the individual magnetic moments of the H atoms within the patient's body. During this process, the H atoms may oscillate around their magnetic poles at their characteristic Larmor frequency. If the tissue is subjected to an additional magnetic field, which is tuned to the Larmor frequency, the H atoms may absorb additional energy, which rotates the net aligned moment of the H atoms. The additional magnetic field may be provided by an RF excitation signal (e.g., the RF signal generated by the RF coils 203). When the additional magnetic field is removed, the magnetic moments of the H atoms may rotate back into alignment with the main magnetic field thereby emitting an MR signal. The MR signal may be received and processed to form an MR image. T1 relaxation may be the process by which the net magnetization grows/returns to its initial maximum value parallel to the main magnetic field. T1 may be the time constant for regrowth of longitudinal magnetization (e.g., along the main magnetic field). T2 relaxation may be the process by which the transverse components of magnetization decay or dephase. T2 may be the time constant for decay/dephasing of transverse magnetization.

If the main magnetic field is uniform across the entire body of the patient, then the RF excitation signal may excite all of the H atoms in the sample non-selectively. Accordingly, in order to image a particular portion of the patient's body, magnetic field gradients Gx, Gy, and Gz (e.g., generated by the gradient coils 202) in the x, y, and z directions, having a particular timing, frequency, and phase, may be superimposed on the uniform magnetic field such that the RF excitation signal may excite the H atoms in a desired slice of the patient's body, and unique phase and frequency information may be encoded in the MR signal depending on the location of the H atoms in the "image slice."

Typically, portions of the patient's body to be imaged are scanned by a sequence of measurement cycles in which the RF excitation signals and the magnetic field gradients Gx, Gy and Gz vary according to an MRI imaging protocol that is being used. A protocol may be designed for one or more tissues to be imaged, diseases, and/or clinical scenarios. A protocol may include a certain number of imaging sequences (also referred to as "pulse sequence") oriented in different planes and/or with different parameters. The imaging sequences may include spin echo sequences, gradient echo sequences, diffusion sequences, inversion recovery sequences, or the like, or any combination thereof. For instance, the spin echo sequences may include a fast spin echo (FSE), a turbo spin echo (TSE), a rapid acquisition with relaxation enhancement (RARE), a half-Fourier acquisition single-shot turbo spin-echo (HASTE), a turbo gradient spin echo (TGSE), or the like, or any combination thereof. The protocol may also include information regarding image contrast and/or ratio, an ROI, slice thickness, an imaging type (e.g., T1 weighted imaging, T2 weighted imaging, proton density weighted imaging, etc.), T1, T2, an echo type (spin echo, fast spin echo (FSE), fast recovery FSE, single shot FSE, gradient recalled echo, fast imaging with steady-state procession, and so on), a flip angle value, acquisition time (TA), echo time (TE), repetition time (TR), an echo train length (ETL), the number of phases, the number of excitations (NEX), inversion time, bandwidth (e.g., RF receiver bandwidth, RF transmitter bandwidth, etc.), or the like, or any combination thereof.

For each MRI scan, the resulting MR signals may be digitized and processed (e.g., by Fourier transform (FT) of data in a k-space, frequency encoding, phase encoding) to reconstruct an image in accordance with the MRI imaging protocol that is used.

In some embodiments, when the second magnetic field is generated, electromagnetic forces may also be generated. Components of the MRI scanner 110 (e.g., cons) may be mechanically strained under the electromagnetic forces, which may generate noses. Further, the change of the second magnetic field may cause the change of electromagnetic forces applied on the components of the MRI scanner 110, which may also generate noises. In some embodiments, different imaging sequences may correspond to different second magnetic fields. Correspondingly, different noises may be generated when different imaging sequences are used or switched by the MRI scanner. In some embodiments, the noise may be reduced based on noise reduction data corresponding to the different imaging sequences. More description of reducing the noise may be found elsewhere in the present disclosure (e.g., FIG. 5, FIG. 15, and the descriptions thereof).

Figure 3:
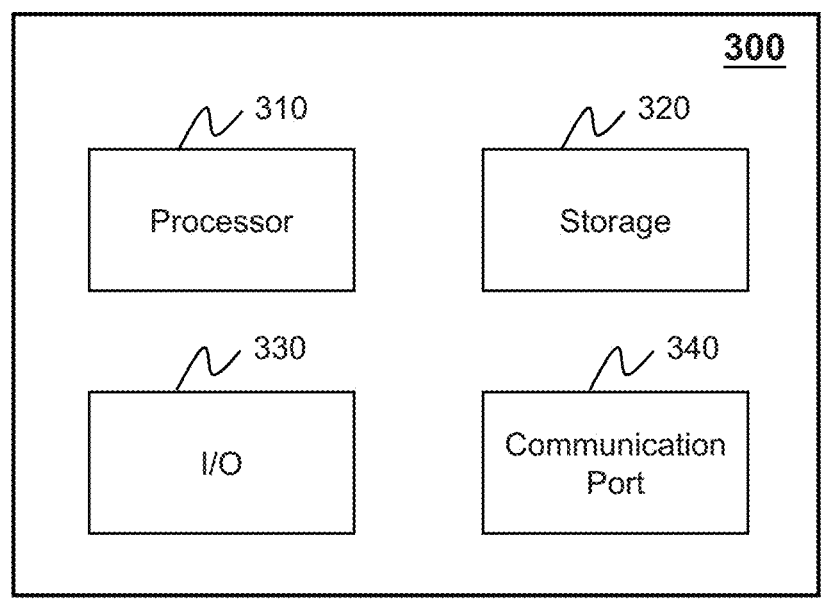
FIG. 3 is a schematic diagram illustrating exemplary hardware and/or software components of an exemplary computing device according to some embodiments of the present disclosure.

FIG. 3 is a schematic diagram illustrating exemplary hardware and/or software components of an exemplary computing device according to some embodiments of the present disclosure. In some embodiments, the processing device 140 may be implemented on the computing device 130. As illustrated in FIG. 3, the computing device 300 may include a processor 310, a storage 320, an input/output (I/O) 330, and a communication port 340.

The processor 310 may execute computer instructions (program code) and perform functions of the processing device 140 in accordance with techniques described herein. The computer instructions may include routines, programs, objects, components, signals, data structures, procedures, modules, and functions, which perform particular functions described herein. For example, the processor 310 may determine an imaging sequence for imaging a subject. Further, the processor 310 may obtain, based on the imaging sequence, noise reduction data from a database. In some embodiments, the processor 310 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration purposes, only one processor is described in the computing device 300. However, it should be noted that the computing device 300 in the present disclosure may also include multiple processors, and thus operations of a method that are performed by one processor as described in the present disclosure may also be jointly or separately performed by the multiple processors. For example, if in the present disclosure the processor of the computing device 300 executes both operations A and B, it should be understood that operations A and step B may also be performed by two different processors jointly or separately in the computing device 300 (e.g., a first processor executes operation A and a second processor executes operation B, or the first and second processors jointly execute operations A and B).

Merely by way example, the processor 310 may receive instructions to follow an MRI scan protocol for imaging/scanning the subject. For example, the processor 310 may instruct the subject positioning system of the MRI scanner 110 to move the subject to a proper position within the bore of the main magnet 201. As another example, the processor 310 may also provide certain control signals to control the main magnet 201 to generate a main magnet field with a specific strength.

The processor 310 may receive control signals to set the shape, amplitude, and/or timing of the gradient waveforms and/or the RF waveforms, and send the set parameters to the waveform generator 216 to instruct the waveform generator 216 to generate a particular gradient waveform sequence and pulse sequence that are to be applied to the gradient coils 202 and the RF coils 203 through the amplifiers 204-207, respectively.

The processor 310 may also sample data (e.g., echoes) from the RE coils 203 based on one or more sampling parameters including, for example, timing information (e.g., the length of data acquisition), the type of k-space data acquisition (e.g., undersampling, oversampling), sampling trajectory (e.g., Cartesian trajectory, non-Cartesian trajectory such as spiral trajectory, radial trajectory), or the like, or a combination thereof. In some embodiments, the timing information may be input by a user (e.g., an operator) or autonomously determined by the imaging system 100 based on one or more other parameters (e.g., clinical needs) of an imaging process. The timing information may correspond to the type of the gradient and RF waveforms that are sent to the gradient coils 202 and the RF coils 203, respectively, so that the MR signals may be correctly sampled. The processor 310 may also generate an MR image by reconstructing the sampled data.

The storage 320 may store data/information obtained from the MRI scanner 110, the terminal device 130, the storage device 150, or any other component of the imaging system 100. In some embodiments, the storage 320 may include a mass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 320 may store one or more programs and/or instructions to perform exemplary methods described in the present disclosure. For example, the storage 320 may store a program for the processing device 140 to collect sound signals in a target time period and determine whether the sound signals contain target feature information. As another example, the storage 320 may store a database including noise reduction data for reducing noise in the imaging system 100.

The I/O 330 may input or output signals, data, or information. In some embodiments, the I/O 330 may enable user interaction with the processing device 40. In some embodiments, the I/O 330 may include an input device and an output device. Exemplary input devices may include a keyboard, a mouse, a touch screen, a microphone, a trackball, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

Merely by way of example, a user (e.g., an operator) may input data related to a subject (e.g., a patient) that is being/to be imaged/scanned through the I/O 330. The data related to the subject may include identification information (e.g., a name, an age, a gender, a medical history, contract information, a physical examination result) and/or the test information including the nature of the MRI scan that must be performed. The user may also input parameters needed for the operation of the MRI scanner 110, such as an imaging sequence, image contrast and/or ratio, a region of interest (ROI), slice thickness, an imaging type (e.g., T1 weighted imaging, T2 weighted imaging, proton density weighted imaging), T1, T2, an echo type (spin echo, fast spin echo (FSE), fast recovery FSE, single shot FSE, gradient recalled echo, fast imaging with steady-state procession), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth), a scan type, a type of sampling, or the like, or any combination thereof. The I/O may also display MR images generated based on the sampled data.

The communication port 340 may be connected to a network (e.g., the network 120) to facilitate data communications. The communication port 340 may establish connections between the processing device 140 and the MRI scanner 110, the terminal device 130, or the storage device 150. The connection may be a wired connection, a wireless connection, or a combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 340 may be a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
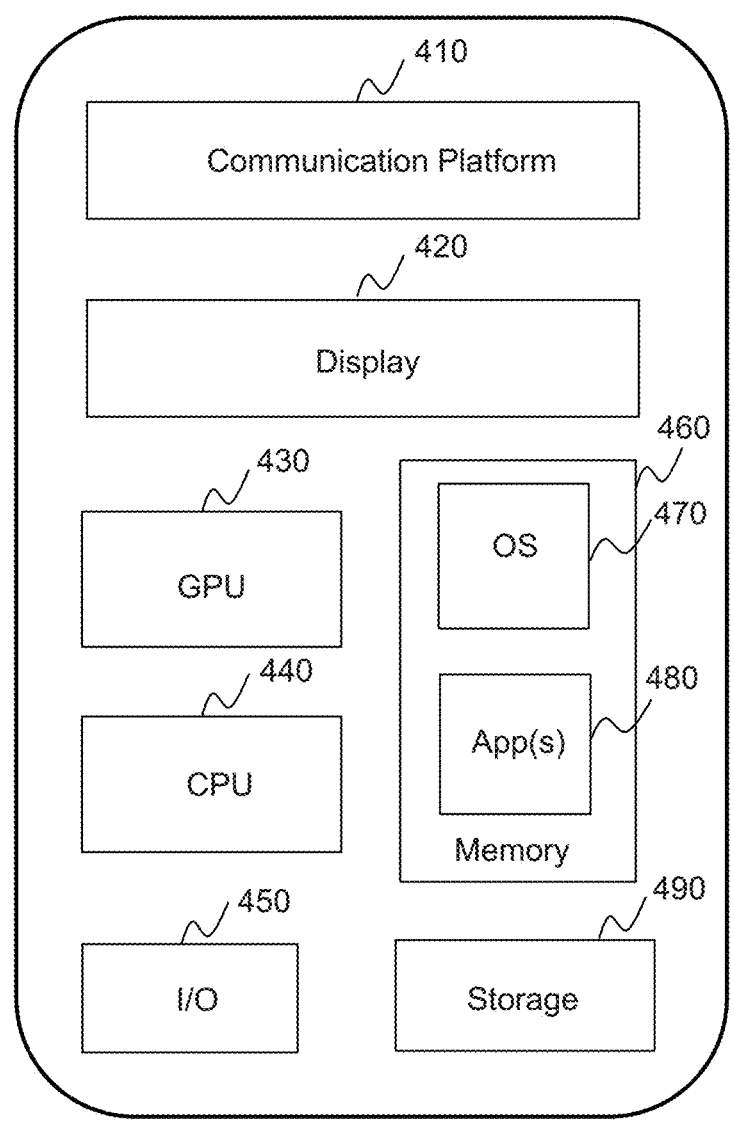
FIG. 4 is a schematic diagram illustrating exemplary hardware and/or software components of an exemplary mobile device according to some embodiments of the present disclosure.

FIG. 4 is a schematic diagram illustrating exemplary hardware and/or software components of an exemplary mobile device according to some embodiments of the present disclosure. In some embodiments, the terminal device 130 may be implemented on the mobile device 400. As illustrated in FIG. 4, the mobile device 400 may include a communication platform 410, a display 420, a graphic processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400.

In some embodiments, a mobile operating system 470 (e.g., iOS, Android, Windows Phone, etc.) and one or more applications 480 may be loaded into the memory 460 from the storage 490 in order to be executed by the CPU 440. The applications 480 may include a browser or any other suitable mobile apps for receiving and rendering information relating to image processing or other information from the processing device 140. User interactions with the information stream may be achieved via the I/O 450 and provided to the processing device 140 and/or other components of the Imaging system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to the blood pressure monitoring as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 5:
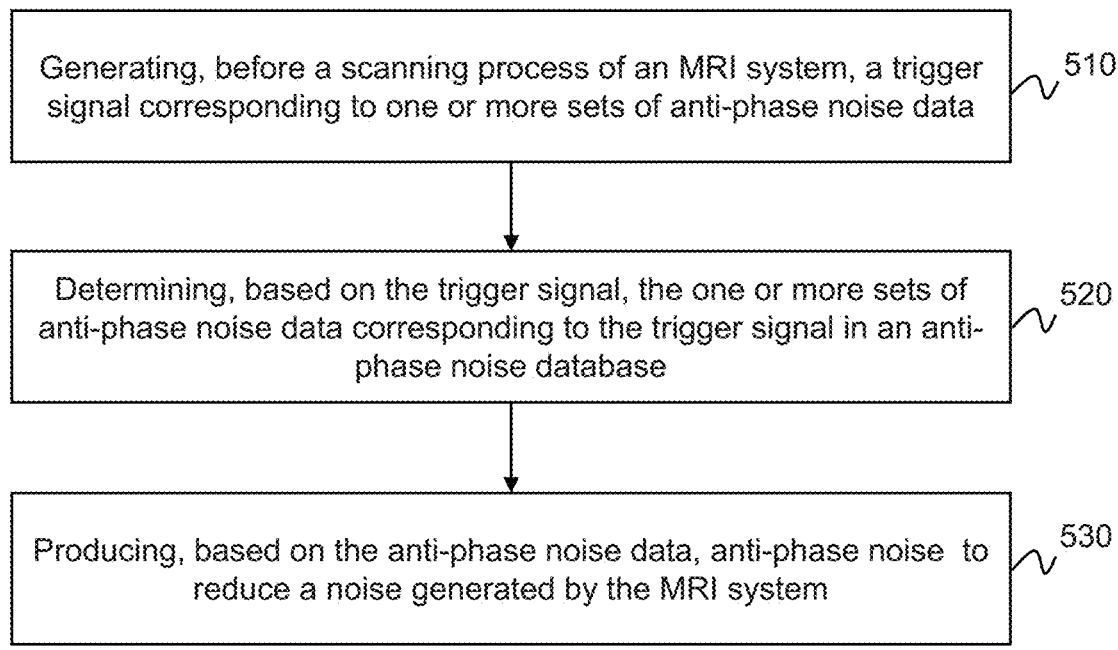
FIG. 5 is a flowchart illustrating an exemplary process for reducing noise according to some embodiments of the present disclosure.

FIG. 5 is a flowchart illustrating an exemplary process for reducing noise according to some embodiments of the present disclosure. In some embodiments, at least part of process 500 may be performed by the processing device 140 (implemented in, for example, the computing device 300 shown in FIG. 3), For example, the process 500 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules illustrated in FIG. 8 or FIG. 14), The operations of the illustrated process presented below are intended to be illustrative. In some embodiments, the process 500 may be accomplished with one or more additional operations not described, and/or without one or more of the operations discussed. Additionally, the order in which the operations of the process 500 is illustrated in FIG. 5 and described below is not intended to be limiting.

In 510, a trigger signal may be generated before a scanning process of an MRI system (e.g., the imaging system 100 in the present disclosure). In some embodiments, the processing device 140 (e.g., the generation module 1430 illustrated in FIG. 14), the noise reduction system 600, and/or the noise reduction device 800 (e.g., the trigger signal generation module 820) may preform operation 510.

In some embodiments, the trigger signal may be generated when a first scanning sequence (also referred to as "imaging sequence") is selected. The first scanning sequence may be used by the MRI system for imaging a subject. In some embodiments, the trigger signal may include information relating to the first scanning sequence. The information relating to the first scanning sequence may include number information or other information representing the first scanning sequence. Merely by way of example, a plurality of scanning sequences may be used by the MRI system for imaging the subject. Each of the plurality of scanning sequences may correspond to a number. When the first scanning sequence is selected, a trigger signal including number information may be generated. The number information may include a number corresponding to the first scanning sequence.

In some embodiments, the trigger signal may correspond to one or more sets of anti-phase noise data (also referred to as "noise reduction data"), The anti-phase noise data may be used to reduce noises (also referred to as "first noise") generated by the MRI system. In some embodiments, the trigger signal may correspond to the one or more sets of anti-phase noise data in different manners. For example, in a one-to-one relationship, each trigger signal may correspond to one distinctive set of anti-phase noise data. As another example, in a one-to-many relationship, each trigger signal may correspond to two or more sets of anti-phase noise data. As a further example, in a many-to-many relationship, two or more trigger signals may correspond to each of two or more sets of anti-phase noise data, and thus at least one set of anti-phase noise data may correspond to the two or more trigger signals. Merely by way of example, noises generated by the MRI system based on different scanning sequences may be similar (e.g., the noises generated by the MRI system based on different scanning sequences may overlap to a certain extent). In such cases, two or more trigger signals generated based on the different scanning sequences may correspond to one set of anti-phase noise data.

In 520, one or more sets of anti-phase noise data corresponding to the trigger signal in an anti-phase noise database may be determined based on the trigger signal. In some embodiments, the processing device 140 (e.g., the determination module 1420 illustrated in FIG. 14), the noise reduction system 600, and/or the noise reduction device 800 (e.g., the anti-phase noise data determination module 830) may preform operation 520.

In some embodiments, the anti-phase noise database may include a plurality of sets of anti-phase noise data corresponding to a plurality of scanning sequences. In some embodiments, the anti-phase noise database may be generated based on sound signals (also referred to as "historical first noise") generated by historical scannings of the MRI system. For illustration purposes, for each of the plurality of scanning sequences, historical first noise generated by the MRI system may be collected when the MRI system was performing a historical scanning on a subject based at least on the scanning sequence. For example, the historical first noise may be collected via one or more sensors (e.g., microphones). The one or more sensors may be fixedly or removably installed at one or more positions in the MRI system (e.g., in an MRI scanner, on a housing of the MRI scanner, or other positions in a scanning room in which the MRI system is located). Further, feature parameters of the historical first noise may be obtained by analyzing the historical first noise based on a sound processing algorithm. The feature parameters may include parameters relating to sound field characteristics and/or frequency characteristics of the historical first noise. Exemplary feature parameters may include a phase, a frequency band, a frequency, an amplitude, a frequency response, energy, a zero crossing rate of the historical first noise, or the like, or any combination thereof. Furthermore, anti-phase noise data corresponding to a specific scanning sequence may be generated based on the feature parameters of the specific sequence. For example, anti-phase noise data may correspond to an anti-phase noise (also referred to as "second noise"). When an anti-phase noise data is selected, one or more components (e.g., a generation device) in the MRI system may generate the anti-phase noise corresponding to the anti-phase noise data accordingly. The anti-phase noise may have a phase opposite to the historical first noise, a same frequency band, a same frequency, a same amplitude, a same frequency response, same energy, and/or a same zero crossing rate as the historical first noise. In such cases, the anti-phase noise may be configured to interfere with the sound signals generated according to the same scanning sequence to reduce the sound signals. Moreover, the anti-phase noise data may be stored in the anti-phase noise database.

In some embodiments, the anti-phase noise database may further include a plurality of indexes. Each index may correspond to a trigger signal. Further, each index may also be linked to one or more sets of anti-phase noise data through one or more pointers. In such cases, the trigger signal may be used as a query to retrieve the anti-phase noise database. When an index matching the query is retrieved, the one or more sets of anti-phase noise data pointed to by the index may be determined.

In some embodiments, the anti-phase noise database may be modified or updated. For example, a spatial noise (also referred to as "first modification noise") generated by the MRI system when imaging the subject based at least on a scanning sequence may be collected. Further, feature parameters of the spatial noise may be obtained by analyzing the spatial noise based on a sound processing algorithm. Furthermore, anti-phase noise modification data corresponding to the scanning sequence may be generated based on the feature parameters. The anti-phase noise modification data may be used to modify the anti-phase noise data corresponding to the scanning sequence at any time or periodically, More description regarding generating and/or modifying the anti-phase noise database may be found elsewhere in the present disclosure (e.g., FIG. 16 and the description thereof).

In 530, anti-phase noise may be produced based on the anti-phase noise data to reduce a noise generated by the MRI system. In some embodiments, the processing device 140 (e.g., the execution module 1440 illustrated in FIG. 14), the noise reduction system 600, and/or the noise reduction device 800 (e.g., the noise reduction execution module 840) may preform operation 530. For example, the anti-phase noise data may be converted into an electrical signal. Further, the electrical signal may be transmitted to a generation device (e.g., a speaker). The generation device may be caused to produce the anti-phase noise based on the electrical signal. In some embodiments, the anti-phase noise may be configured to interfere with the noise generated by the MRI system to reduce the noise.

According to the above-mentioned noise reduction method (also referred to as "active noise reduction method"), anti-phase noise data may be determined before or simultaneously with the scanning process of the MRI system. Further, during the scanning process, anti-phase noise may be produced synchronously with the noise generated by the MRI system to reduce the noise, which may solve the problem of incomplete noise reduction caused by feedback delay in a traditional active noise reduction process. Moreover, instead of installing a plurality of sensors for collecting noises in real time and generating anti-phase noise based on the noises, the anti-phase noise may be produced based on the anti-phase noise data in the anti-phase noise database, which may make the noise reduction process cost-effective and easy to operate.

It should be noted that the above description of the process 500 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, one or more operations of the process 500 may be added or omitted. For example, the process 500 may include an operation in which the anti-phase noise database may be generated and/or an operation in which the anti-phase noise database may be modified.

Figure 6:
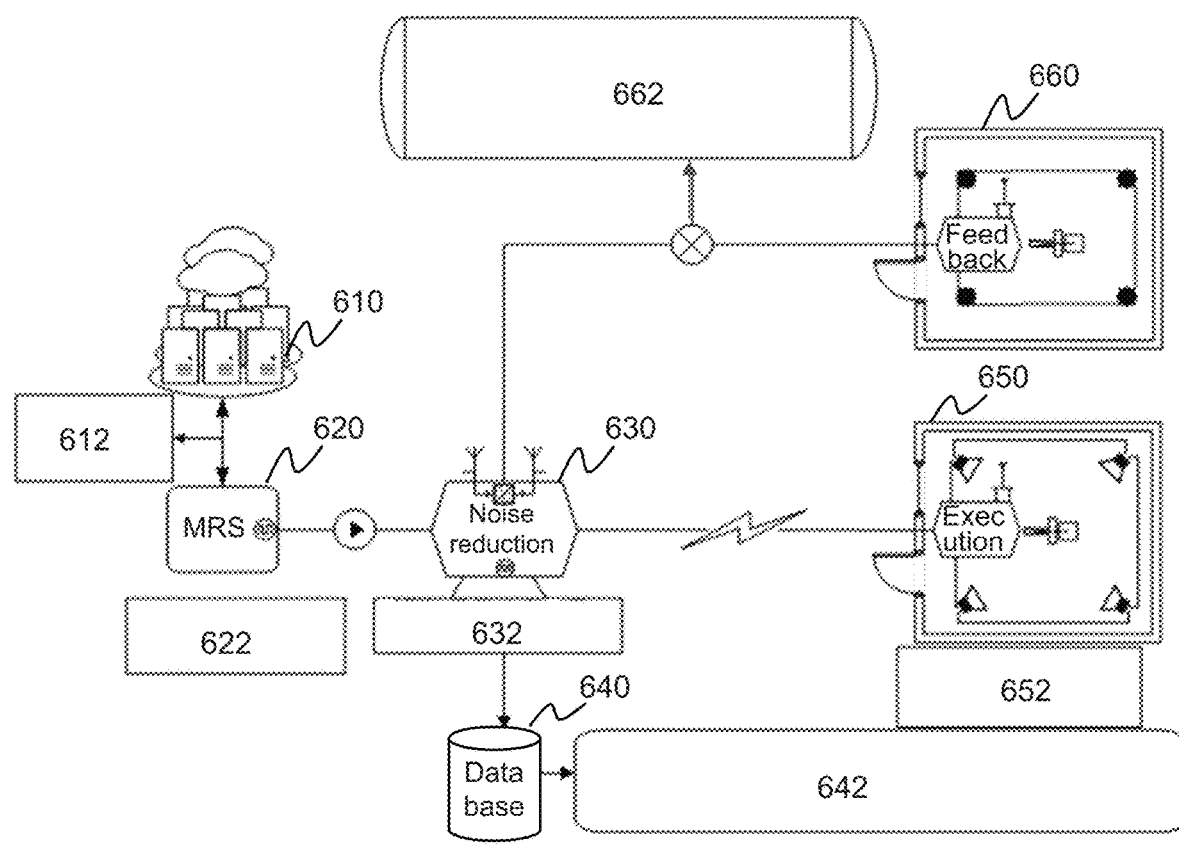
FIG. 6 is a schematic diagram illustrating an exemplary noise reduction system according to some embodiments of the present disclosure.

FIG. 6 is a schematic diagram illustrating an exemplary noise reduction system according to some embodiments of the present disclosure. In some embodiments, the imaging system 110 described in connection with FIG. 1 may be implemented on the noise reduction system 600. As illustrated in FIG. 6, the noise reduction system 600 may include a cloud platform 610, a magnetic resonance spectrum (MRS) assembly 620, a noise reduction processing assembly 630, a database 640, a noise reduction execution assembly 650, and a noise reduction feedback assembly 660. In some embodiments, a noise reduction process (e.g., a process including operation 612, 622, 632, 642, 652, 662) may be performed in the noise reduction system 600.

The cloud platform 610 may be configured to provide a noise reduction processing algorithm. The noise reduction processing algorithm may be used to generate a plurality sets of anti-phase noise data corresponding to a plurality of scanning sequences. For example, according to the noise reduction processing algorithm, a processing device (not shown) of the noise reduction system 600 may obtain a historical first noise generated by the MRI system when the MRI system was performing a historical scanning on a subject based at least on a scanning sequence. Further, the processing device may obtain feature parameters of the historical first noise (e.g., based on a sound processing algorithm). Furthermore, according to the noise reduction processing algorithm, the processing device may generate anti-phase noise data corresponding to the scanning sequence based on the feature parameters. In some embodiments, the operation 612 may be performed on the cloud platform 610. In 612, the noise reduction processing algorithm may be adjusted to improve the efficiency of noise reduction. For example, the noise reduction processing algorithm may be adjusted such that more kinds of feature parameters of the historical first noise may be obtained based on the noise reduction processing algorithm. Accordingly, the anti-phase noise data may be generated based on the more kinds of feature parameters, which may interfere with the historical first noise to reduce the historical first noise more effectively.

The MRS assembly 620 may be configured to determine a scanning sequence used by an MRI system (e.g., the imaging system 100 in the present disclosure). In some embodiments, the MRS assembly 620 may be further configured to generate a trigger signal based on the scanning sequence. For example, in 622, when (or before) the MRI system images a subject based at least on the scanning sequence, a trigger signal corresponding to the scanning sequence may be generated. In some embodiments, when the scanning sequence is determined for imaging the subject, the MRS assembly 620 may generate and/or transmit the trigger signal immediately. In such cases, other components (e.g., the noise reduction processing assembly 630, the noise reduction execution assembly 650) may operate in response to the trigger signal, such that an anti-phase noise may be produced synchronously with a noise generated by the MRI system to reduce the noise.

The noise reduction processing assembly 630 may be configured to determine anti-phase noise data corresponding to the trigger signal. For example, the noise reduction processing assembly 630 may perform operation 632. In 632, the noise reduction processing assembly 630 may retrieve, based on the trigger signal, the database 640 and determine the anti-phase noise data.

The database 640 may include a plurality sets of anti-phase noise data corresponding to a plurality of scanning sequences. In some embodiments, the anti-phase noise database may be generated based on sound signals (also referred to as "historical first noise") generated by historical scannings of the MRI system. For example, in 642, a historical first noise generated by the MRI system may be collected when the MRI system was performing a historical scanning on a subject based at least on the scanning sequence. Further, feature parameters of the historical first noise may be obtained by analyzing the historical first noise based on a sound processing algorithm. Furthermore, anti-phase noise data corresponding to the scanning sequence may be generated based on the feature parameters. For example, anti-phase noise data may be related to an anti-phase noise (also referred to as "second noise"). Optionally or additionally, the second noise may include a sound stage and/or a silent stage. The anti-phase noise may correspond to the sound stage. Moreover, the anti-phase noise data may be stored in the database 640.

The noise reduction execution assembly 650 may be configured to execute a noise reduction process. For example, the noise reduction execution assembly 650 may include or be connected to one or more generation devices (e.g., speakers). In 652, the noise reduction execution assembly 650 may cause at least one of the one or more generation devices to produce an anti-phase noise based on the anti-phase noise data.

The noise reduction feedback assembly 660 may be configured to modify or update the anti-phase noise data in the database 640. For example, in 662, a spatial noise (also referred to as "first modification noise") generated by the MRI system when imaging the subject based at least on a scanning sequence may be collected. Further, feature parameters of the spatial noise may be obtained by analyzing the spatial noise based on a sound processing algorithm. Furthermore, anti-phase noise modification data corresponding to the scanning sequence may be generated based on the feature parameters. The anti-phase noise modification data may be used to modify the anti-phase noise data corresponding to the scanning sequence at any time or periodically. More description regarding modifying the anti-phase noise database may be found elsewhere in the present disclosure (e.g., FIG. 16 and the description thereof).

It should be noted that the above description of the noise reduction system 600 is merely provided for the purposes of illustration and not intended to limit the scope of the present disclosure. For persons having ordinary skill in the art, multiple variations and modifications may be made under the teachings of the present disclosure. However, those variations and modifications do not depart from the scope of the present disclosure. For example, the noise reduction processing assembly 630, the noise reduction execution assembly 650, and the noise reduction feedback assembly 660 may be integrated into one single assembly. The single assembly may perform functions of the noise reduction processing assembly 630, the noise reduction execution assembly 650, and the noise reduction feedback assembly 660.

Figure 7A:
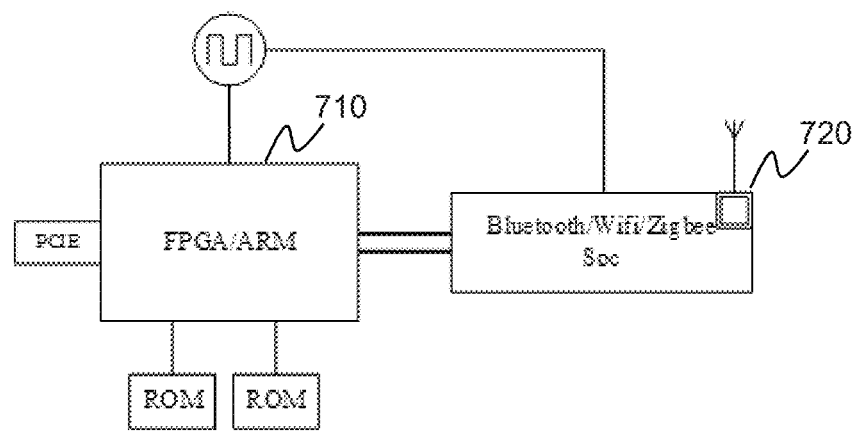
FIG. 7A is a schematic diagram illustrating an exemplary noise reduction processing assembly according to some embodiments of the present disclosure.

FIG. 7A is a schematic diagram illustrating an exemplary noise reduction processing assembly according to some embodiments of the present disclosure. As illustrated in FIG. 7A, the noise reduction processing assembly 630 may include a processing component 710 and a system-on-chip (Soc) 720. In some embodiments, at least part of the noise reduction processing assembly 630 (e.g., the processing component 710 the Soc 720) may be integrated into the processing device 140.

The processing component 710 may be configured to obtain a trigger signal. For example, the processing component 710 may receive the trigger signal from the MRS assembly 620 illustrated in FIG. 6 via a communication port (e.g., a peripheral component interconnect express (PCIE)). In some embodiments, the processing component 710 may be further configured to determine anti-phase noise data from a database (e.g., the database 640 illustrated in FIG. 6) based on the trigger signal.

In some embodiments, as illustrated in FIG. 7A, the processing component 710 may include a field programmable gate array (FPGA) or an advanced RISC machine (ARM). The FPGA and/or the ARM may include a clock. The clock may be configured to generate a clock signal. The Soc 720 may operate based on the clock signal. For example, the Soc 720 may send data to an external device according to a frequency that is a frequency multiplication of the frequency of the clock signal. In some embodiments, the frequency multiplication of the frequency of the clock signal may have be different from an operating frequency of the MRI system. As used herein, the operating frequency refers to operating frequencies of one or more components (e.g., the RF coils 203 illustrated in FIG. 2) of the MRI system. For example, the operating frequency of the MRI system may include a transmitting frequency (e.g., a frequency of RF signals generated by the RF coils 203) and/or a receiving frequency (e.g., a frequency of MR signals detected by the RF coils 203) of the RF coils 203. Merely by way of example, the operating frequency of the MRI system may be 64 MHz. The clock may be configured to generate a clock signal in 3 MHz, whose frequency multiplication can never equal 64 MHz. In such cases, since an interference between signals of different frequencies may be relatively small, an electromagnetic compatibility (EMC) of the noise reduction processing assembly 630 may be improved. In some embodiments, the processing component 710 may be connected to a storage device (e.g., the read-only memory (ROM) illustrated in FIG. 7A). Data/information (e.g., configuration information of the clock, production information of the FPGA and/or the ARM) relating to the processing component 710 may be stored in the storage device.

The Soc 720 may be configured to transmit the anti-phase noise data to an external device (e.g., the noise reduction execution assembly 650 illustrated in FIG. 6). In some embodiments, the Soc 720 may transmit the anti-phase noise data to the external device wirelessly. For example, the Soc 720 may be or include a wireless chip (e.g., a Bluetooth chip, a Wifi chip, a ZigBee chip, etc.). Then the Soc 720 may operate based on the frequency multiplication of the clock signal generated by the clock in the processing component 710 and transmit the anti-phase noise data to the external device wirelessly.

Figure 7B:
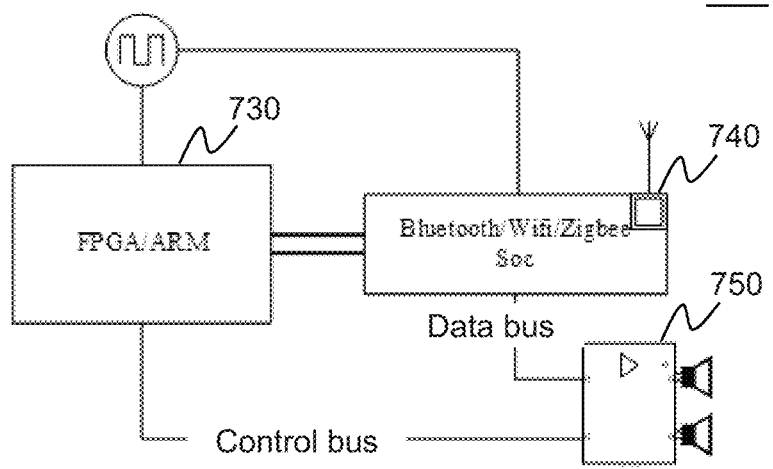
FIG. 7B is a schematic diagram illustrating an exemplary noise reduction execution assembly according to some embodiments of the present disclosure.

FIG. 7B is a schematic diagram illustrating an exemplary noise reduction execution assembly according to some embodiments of the present disclosure. As illustrated in FIG. 7B, the noise reduction execution assembly 650 may include a processing component 730, a system-on-chip (Soc) 740, and a generation device 750. In some embodiments, at least part of the noise reduction execution assembly 650 (e.g., the processing component 730, the Soc 740) may be integrated into the processing device 140.

The processing component 730 may be configured to obtain anti-phase noise data from the noise reduction processing assembly 630, In some embodiments, the processing component 730 may further generate execution information based on which the generation device 750 may produce an anti-phase noise, and/or control information for controlling the generation device 750. In some embodiments, the control information may be transmitted to the generation device 750 via a control bus.

The Soc 740 may be configured to transmit the execution information to the generation device 750. For example, the Soc 740 may transmit the execution information to the generation device 750 wirelessly and/or via a data bus.

In some embodiments, the processing component 730 and the Soc 740 may be similar to the processing component 710 and the Soc 720, respectively, and the descriptions thereof are not repeated here.

The generation device 750 may produce the anti-phase noise based on the execution information. In some embodiments, the generation device 750 may be a piezoelectric ceramic speaker. The piezoelectric ceramic speaker may be made of piezoelectric ceramic material, which may not cause an electromagnetic interference with the MRI system, thereby improving the EMC of the noise reduction execution assembly 640.

In some embodiments, other components (a resistor, a capacitor, etc.) of the noise reduction processing assembly 630 and/or the noise reduction execution assembly 650 may be non-magnetic, such that EMC of the noise reduction processing assembly 630 and/or the noise reduction execution assembly 640 may be further improved.

It should be noted that the above description of the examples in FIGS. 7A and 7B are merely provided for the purposes of illustration and not intended to limit the scope of the present disclosure. For persons having ordinary skill in the art, multiple variations and modifications may be made under the teachings of the present disclosure. However, those variations and modifications do not depart from the scope of the present disclosure.

Figure 8:
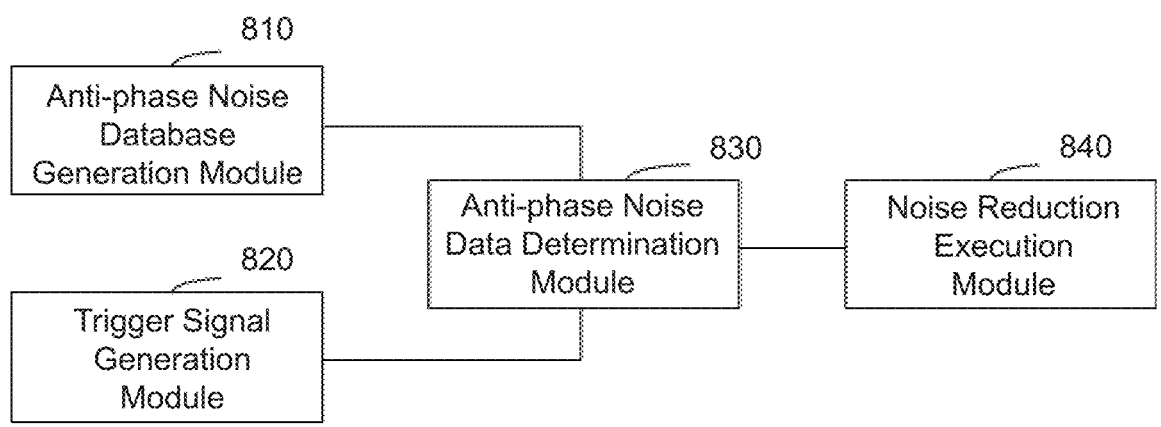
FIG. 8 is a block diagram illustrating an exemplary noise reduction device according to some embodiments of the present disclosure.

FIG. 8 is a block diagram illustrating an exemplary noise reduction device according to some embodiments of the present disclosure. In some embodiments, the noise reduction device 800 may be implemented on various devices (e.g., the computing device 300 illustrated in FIG. 3, the mobile device 400 illustrated in FIG. 4). In some embodiments, the noise reduction device 800 may be integrated into the processing device 140. As illustrated in FIG. 8, the noise reduction device 800 may include an anti-phase noise database generation module 810, a trigger signal generation module 820, an anti-phase noise determination module 830, and a noise reduction execution module 840.

Figure 9:
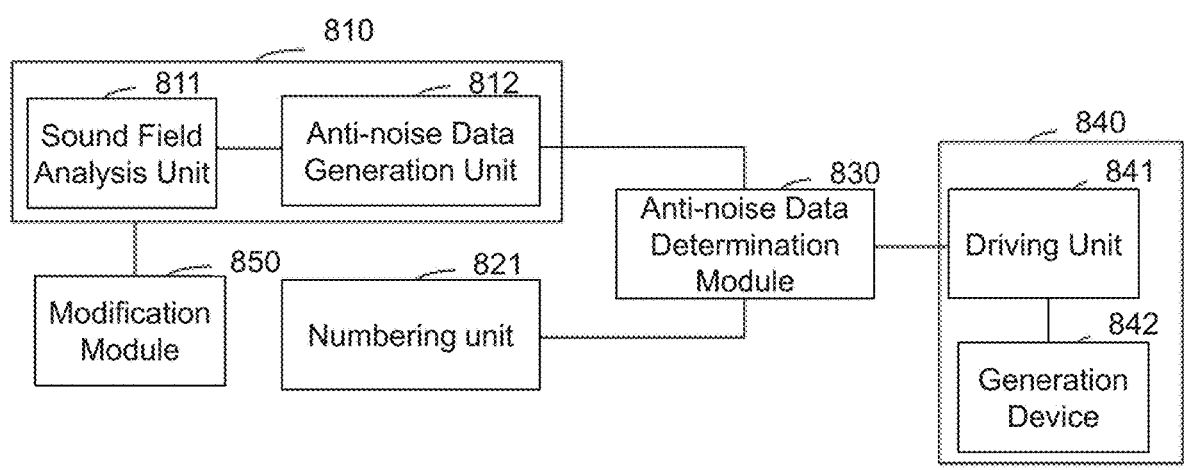
FIG. 9 is a block diagram illustrating an exemplary noise reduction device according to some embodiments of the present disclosure.

The anti-phase noise database generation module 810 may be configured to generate an anti-phase noise database. The anti-phase noise database may include a plurality sets of anti-phase noise data corresponding to a plurality of scanning sequences. In some embodiments, the anti-phase noise database may be generated based on sound signals generated by an MRI system. Specifically, as illustrated in FIG. 9, the anti-phase noise database generation module 810 may include a sound field analysis unit 811 and an anti-phase noise data generation unit 812. The sound field analysis unit 811 may be connected to an MRI system. For each of the plurality of scanning sequences, the sound field analysis unit 811 may collect a sound signal generated by the MRI system when the MRI system images a subject based at least on the scanning sequence. Further, the sound field analysis unit 811 may analyze the sound signal. For example, the sound field analysis unit 811 may obtain feature parameters of the sound signal by analyzing the sound signal based on a sound processing algorithm. Furthermore, the anti-phase noise data generation unit 812 may generate anti-phase noise data corresponding to the scanning sequence based on the feature parameters. Moreover, the anti-phase noise data generation unit 812 may store the anti-phase noise data in the anti-phase noise database.

The trigger signal generation module 820 may be configured to generate a trigger signal. In some embodiments, each trigger signal may correspond to one or more sets of anti-phase noise data in the anti-phase noise database. In some embodiments, the trigger signal generation module 820 may generate the trigger signal when a first scanning sequence in a plurality of scanning sequences is selected. Specifically, the trigger signal generation module 820 may include a numbering unit 821. The numbering unit 821 may be connected to the MRI system. The numbering unit 821 may be configured to number the plurality of imaging sequences. When the first scanning sequence is selected, the numbering unit 821 may generate a trigger signal including number information. The number information may include a number corresponding to the first scanning sequence. In some embodiments, the numbering unit 821 may be connected to the anti-phase noise determination module 830. The trigger signal may be transmitted to the anti-phase noise determination module 830 for further processing.

The anti-phase noise determination module 830 may be configured to determine, based on the trigger signal, one or more sets of anti-phase noise data in the anti-phase noise database. In some embodiments, the anti-phase noise determination module 830 may be connected to the anti-phase noise database generation module 810 and/or the trigger signal generation module 820. In some embodiments, the anti-phase noise determination module 830 may receive the trigger signal transmitted from the trigger signal generation module 820. Further, the anti-phase noise determination module 830 may determine, based on the trigger signal, one or more sets of anti-phase noise data in the anti-phase noise database. For example, the anti-phase noise database may include a plurality of indexes. Each index may correspond to a trigger signal. Further, each index may also be linked to one or more sets of anti-phase noise data through one or more pointers. The anti-phase noise determination module 830 may retrieve the anti-phase noise database using the trigger signal as a query. When an index matching the query is retrieved, the one or more sets of anti-phase noise data pointed to by the index may be determined. In some embodiments, the anti-phase noise determination module 830 may be implemented on a microcontroller unit (MCU), a microprocessor, and/or other devices that have the functions of the anti-phase noise determination module 830.

The noise reduction execution module 840 may be configured to causing a generation device to produce, based on the one or more sets of anti-phase noise data, an anti-phase noise to reduce the noise generated by the MRI system. In some embodiments, the noise reduction execution module 840 may include a driving unit 841 and a generation device 842. The driving unit 841 may be connected to the anti-phase noise determination module 830. In some embodiments, the driving unit 841 may be configured to obtain the one or more sets of anti-phase noise data determined by the anti-phase noise determination module 830. Further, the driving unit 841 may be configured to generate a driving instruction. Furthermore, the generation device 842 may produce the anti-phase noise based on the driving instruction. In some embodiments, the noise reduction execution module 840 may be implemented on an MCU, a microprocessor, and/or other devices that have the functions of the noise reduction execution module 840.

In some embodiments, as illustrated in FIG. 9, the noise reduction device 800 may also include a modification module 850. The modification module 850 may be configured to modify the anti-phase noise database. Specifically, the modification module 850 may be connected to the MRI system and/or the anti-phase noise database generation module 810. The modification module 850 may collect a spatial noise generated by the MRI system when imaging the subject based at least on a scanning sequence. Further, the modification module 850 may obtain feature parameters of the spatial noise by analyzing the spatial noise based on a sound processing algorithm. Furthermore, the modification module 850 may generate anti-phase noise modification data corresponding to the scanning sequence based on the feature parameters. The anti-phase noise modification data may be used to modify the anti-phase noise data corresponding to the scanning sequence at any time or periodically.

In some embodiments, the modules and/or units in the noise reduction device 800 may be connected to or communicate with each other via a wired connection or a wireless connection. The wired connection may include a metal cable, an optical cable, a hybrid cable, or the Ike, or any combination thereof. The wireless connection may include a Local Area Network (LAN), a Wide Area Network (WAN), a Bluetooth, a ZigBee, a Wi-Fi network, a Near Field Communication (NFC), or the like, or any combination thereof. Two or more of the modules may be combined as a single module, and any one of the modules may be divided into two or more units.

Figure 10:
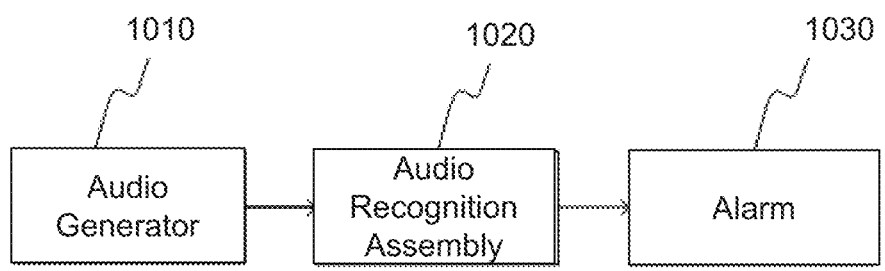
FIG. 10 is a block diagram illustrating an exemplary alarm device according to some embodiments of the present disclosure.

FIG. 10 is a block diagram illustrating an exemplary alarm device according to some embodiments of the present disclosure. In some embodiments, the alarm device 1000 may be integrated in a scanner of an imaging system (e.g., the MRI scanner 110 of the imaging system 100 illustrated in FIG. 1) as a component thereof. In some embodiments, the alarm device 1000 may also be provided as a separate device communicating with one or more components of the imaging system. As illustrated in FIG. 10, the alarm device 1000 may include an audio generator (also referred to as "sound assembly") 1010, an audio recognition assembly (also referred to as "recognition assembly") 1020, and an alarm (also referred to as "alarm assembly") 1030. In some embodiments, at least part of the alarm device 1000 (e.g., the audio recognition assembly 1020) may be implemented on various devices (e.g., the computing device 300 illustrated in FIG. 3, the mobile device 400 illustrated in FIG. 4). In some embodiments, at least part of the alarm device 1000 (e.g., the audio recognition assembly 1020) may be integrated into the processing device 140.

The audio generator 1010 may be configured to generate sound (also referred to as "target sound signals") with specific feature information. The specific feature information of the target sound signals may include specific voiceprint information (also referred to as "target feature information") of the target sound signals. In some embodiments, the specific voiceprint information may include feature parameters relating to a specific timbre. Exemplary feature parameters may include a spectrum, a cepstrum, a formant, a fundamental tone, a reflection coefficient of the sound, or the like, or any combination thereof. More description of the audio generator 1010 may be found elsewhere in the present disclosure (e.g., FIG. 12 and the description thereof).

Figure 11:
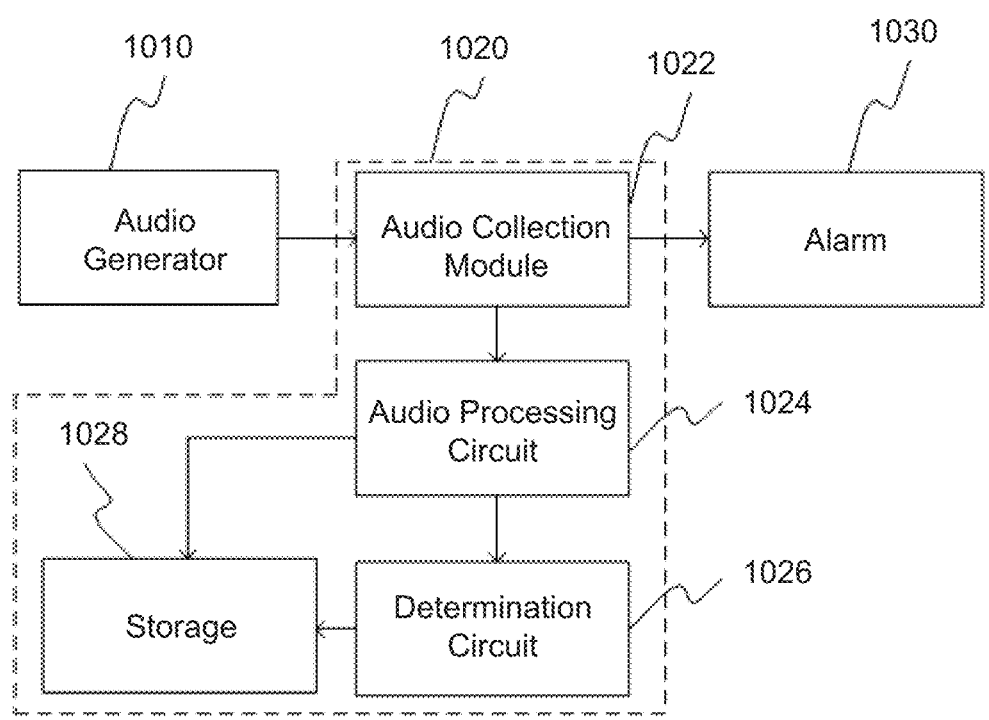
FIG. 11 is a block diagram illustrating an exemplary alarm device according to some embodiments of the present disclosure.

In some embodiments, as illustrated in FIG. 11, the audio recognition assembly 1020 may include an audio collection module 1022, an audio processing circuit 1024, a determination circuit 1026, and a storage 1028.

The audio collection module 1022 may be configured to collect the surrounding sound signals in real time. In some embodiments, the surrounding sound signals refer to sound signals relating to the imaging system. For example, the surrounding sound signals may include sound signals in a scanning room in which the imaging system is located. In some embodiments, the audio collection module 1022 may collect the surrounding sound signals via one or more sensors. For example, the audio collection module 1022 may include a microphone array. The microphone array may be installed in the scanner of the imaging system. When collecting the surrounding sound signals, the audio collection module 1022 may adjust, based on information relating to the imaging system (e.g., a position of a table on which a subject may be placed, a position of the subject, a position of the audio generator 1010), a direction in which the microphone collects the sound signals to point to the audio generator 1010. In such cases, a signal-to-noise ratio of the collected sound signals (i.e., a ratio of the sound with specific voiceprint information to other components in the surrounding sound signals) may be improved. Optionally or additionally, the information relating to the imaging system may be obtained based on an image recognition algorithm.

The audio processing circuit 1024 may be connected to the audio collection module 1022. In some embodiments, the audio processing circuit 1024 may be configured to extract voiceprint information from the surrounding sound signals. For example, the voiceprint information may include feature parameters relating to a timbre. The audio processing circuit 1024 may extract the feature parameters from the surrounding sound signals based on a voiceprint recognition algorithm. In some embodiments, the feature parameters may be transmitted to the determination circuit 1026 for further processing. In some embodiments, the feature parameters may be transmitted to the storage 1028 for storage. In some embodiments, the audio processing circuit 1024 may pre-extract the feature parameters relating to the specific timbre from the sound with specific voiceprint information generated by the audio generator 1010. Further, the audio processing circuit 1024 may transmit the feature parameters relating to the specific timbre to the storage 1028. The feature parameters relating to the specific timbre may be stored in the storage 1028 as a recognition template.

The determination circuit 1026 may be connected to the audio processing circuit 1024 and/or the alarm 1030. In some embodiments, the determination circuit 1026 may be configured to determine whether the surrounding sound signals in a predetermined time period contain specific voiceprint information. As used herein, the predetermined time period refers to a time period of a predetermined duration with the current moment as a time cut-off point. In some embodiments, the predetermined time period may be related to a duration of the sound possibly generated by the audio generator 1010 and/or a cycle duration of the noise possibly generated by the imaging system. For example, the predetermined time period may be longer than the duration of the sound generated by the audio generator 1010. As another example, the predetermined time period may be shorter than the cycle duration of the noise generated by the imaging system. In some alternative embodiments, the duration of the sound generated by the audio generator 1010 may be relatively short. If the predetermined time period is too long, the sound generated by the audio generator 1010 may not be detected in time. If the predetermined time period is too short, the feature parameters may not be extracted effectively from the surrounding sound signals, which may cause errors in a determination process. To this occasion, in some embodiments, the predetermined time period may be $10^2 \sim 10^3$ ms, in which the sound generated by the audio generator 1010 may be detected in time and/or the feature parameters may be extracted effectively.

In some embodiments, the determination circuit 1026 may receive the feature parameters of the surrounding sound signals in the predetermined time period from the audio processing circuit 1024. In some embodiments, the determination circuit 1026 may obtain the feature parameters of the surrounding sound signals in the predetermined time period from the storage 1028. Further, the determination circuit 1026 may obtain the recognition template from the storage 1028. Furthermore, the determination circuit 1026 may determine whether the feature parameters of the surrounding sound signals contain the feature parameters relating to the specific timbre. In some embodiments, the determination circuit 1026 may determine, based on a recognition algorithm, whether the surrounding sound signals contain the feature parameters relating to the specific timbre. Exemplary recognition algorithms may include a template matching algorithm, a nearest neighbor algorithm, a neural network algorithm, a hidden Markov model (HMM) algorithm, a Gaussian mixture model (GMM) algorithm, a vector quantization (VQ) clustering algorithm, a polynomial classifier algorithm, or the like, or any combination thereof. In some embodiments, in response to determining that the feature parameters of the surrounding sound signals include the feature parameters relating to the specific timbre, the determination circuit 1026 may generate alarm information.

In some embodiments, a determination process of the determination circuit 1026 may be affected by the noises generated by the imaging system. For example, a spectral distribution and/or an energy distribution of the noises may vary according to an imaging sequence and/or other parameters based on which the imaging system images the subject. In some embodiments, the determination circuit 1026 may be further configured to perform a noise reduction process on the surrounding sound signals. For example, the determination circuit 1026 may divide the surrounding sound signals into a plurality of audio frames (also referred to as "frames"). Further, the determination circuit 1026 may recognize audio frames including noises from the plurality of audio frames. As another example, the determination circuit 1026 may estimate, using a trained noise estimation model, noises generated by the imaging system when imaging the subject. Then the determination circuit 1026 may perform a noise reduction process on the surrounding sound signals based on the recognized audio frame and/or the estimated noise. More description regarding recognizing and/or reducing the noises may be found elsewhere in the present disclosure (e.g., FIG. 13, FIG. 18, FIG. 19, and the descriptions thereof).

The storage 1028 may be connected to the determination circuit 1026 and/or the audio processing circuit 1024. In some embodiments, the storage 1028 may be configured to store the feature parameters relating to the specific timbre and/or the feature parameters from the surrounding sound signals. In some embodiments, the storage 1028 may be a memory chip, such as a trans-flash (TF) card, a secure digital memory (SD) card, or the like, or any combination thereof. In some embodiments, the storage 1028 may be implemented on various devices (e.g., the storage device 150 illustrated in FIG. 1, the storage 320 illustrated in FIG. 3, the storage 490 illustrated in FIG. 4).

The alarm 1030 may be connected to the audio recognition assembly 1020. In some embodiments, the alarm 1030 may be configured to receive the alarm information generated by the recognition assembly 1020. Further, the alarm 1030 may generate an alarm signal based on the alarm information.

It should be noted that the above description of the alarm device 1000 is merely provided for the purposes of illustration and not intended to limit the scope of the present disclosure. For persons having ordinary skill in the art, multiple variations and modifications may be made under the teachings of the present disclosure. However, those variations and modifications do not depart from the scope of the present disclosure. For example, the audio processing circuit 1024 and the determination circuit 1026 may be integrated (e.g., on a chip). As another example, the storage 1028 may be integrated with the audio processing circuit 1024 and/or the determination circuit 1026. As a further example, audio recognition assembly 1020 and/or the alarm 1030 may be omitted. The audio generator may be integrated with a pressure detection module. The pressure detection module may be configured to detect a pressure inside the audio generator. When detecting that the pressure inside the audio generator changes, the pressure detection module may generate and/or transmitted an alarm signal wirelessly (e.g., to a terminal device of a doctor).

Figure 12:
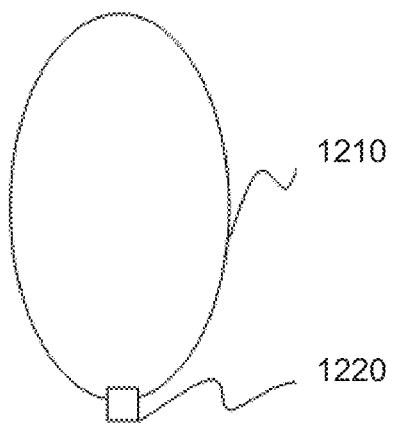
FIG. 12 is a schematic diagram illustrating an exemplary sound assembly according to some embodiments of the present disclosure.

FIG. 12 is a schematic diagram illustrating an exemplary sound assembly according to some embodiments of the present disclosure. As illustrated in FIG. 12, the sound assembly 1200 may include a deformable housing 1210 and a whistle core 1220.

In some embodiments, the deformable housing 1210 may be squeezable and deformable. In some embodiments, the deformable housing 1210 may include a through hole. The whistle core 1220 may be provided on the deformable housing 1210. The whistle core 1220 may communicate with the deformable housing 1210 through the through hole. When the deformable housing 1210 is squeezed under a squeezing force, a pressure inside the deformable housing 1210 may be changed. Further, air inside the deformable housing 1210 may be discharged through the through hole. When the air passes through the whistle core 1220, a sound with specific voiceprint information may be produced. In some embodiments, the sound with specific voiceprint information may be used for indicating whether a subject has an alarm behavior. In some embodiments, when the squeezing force is removed, the deformable housing 1210 may be automatically restored to an original state. In some embodiments, the deformable housing 1210 may have a simple structure, and may be cost-effective and easy to replace. In some embodiments, the deformable housing 1210 may be made of deformable materials, such as a high-elastic polymer material with reversible deformation. Optionally or additionally, the deformable materials may be compatible with the imaging system. For example, the deformable materials may be capable of reducing and/or avoiding electromagnetic interferences with the imaging system.

In some alternative embodiments, the deformable housing 1210 may include a rubber ball including a through hole. The whistle core 1220 may be provided on a wall of the rubber ball. When the rubber ball is squeezed under a squeezing force, air inside the rubber ball may be discharged through the through hole in the form of airflow. The airflow may hit an opening of the whistle core 1220 when passing through the whistle core 1220, which may cause the air inside the whistle core 1220 to vibrate, thereby generating a sound with the specific voiceprint information. In some embodiments, the rubber ball may be made of rubber, which may be a high-elastic polymer material with reversible deformation. The rubber may be elastic at room temperature and may be deformed greatly under a small external force. After the external force is removed, the rubber may be restored to an original shape. Moreover, the rubber may be cheap and easy to obtain. In some embodiments, the deformable housing 1210 may have any shape. For example, the deformable housing 1210 may be a rubber rod with a through hole, or a rubber product of other shapes suitable for hand grip.

In some embodiments, the sound assembly 1200 may be installed in a scanner of the imaging system (e.g., the scanner 110 of the imaging system 100 illustrated in FIG. 1). In some embodiments, the sound assembly 1200 may be provided as a separate device in the scanner of the imaging system. For example, the sound assembly 1200 may be held by a patient under the scanning, and not be electrically or physically connected to other components (or structures) of the imaging system, which may be convenient to use.

It should be noted that the example illustrated in FIG. 12 is provided for the purposes of illustration, and not intended to limit the scope of the present disclosure. For persons having ordinary skills in the art, various modifications and changes in the forms and details of the application of the above method and system may occur without departing from the principles of the present disclosure. In addition, the count, the position, the shape, the material, and/or the size of a component (e.g., the deformable housing 1210, the whistle core 1220) of the sound assembly 1200 are illustrative, and may be changed according to different application scenarios.

Figure 13:
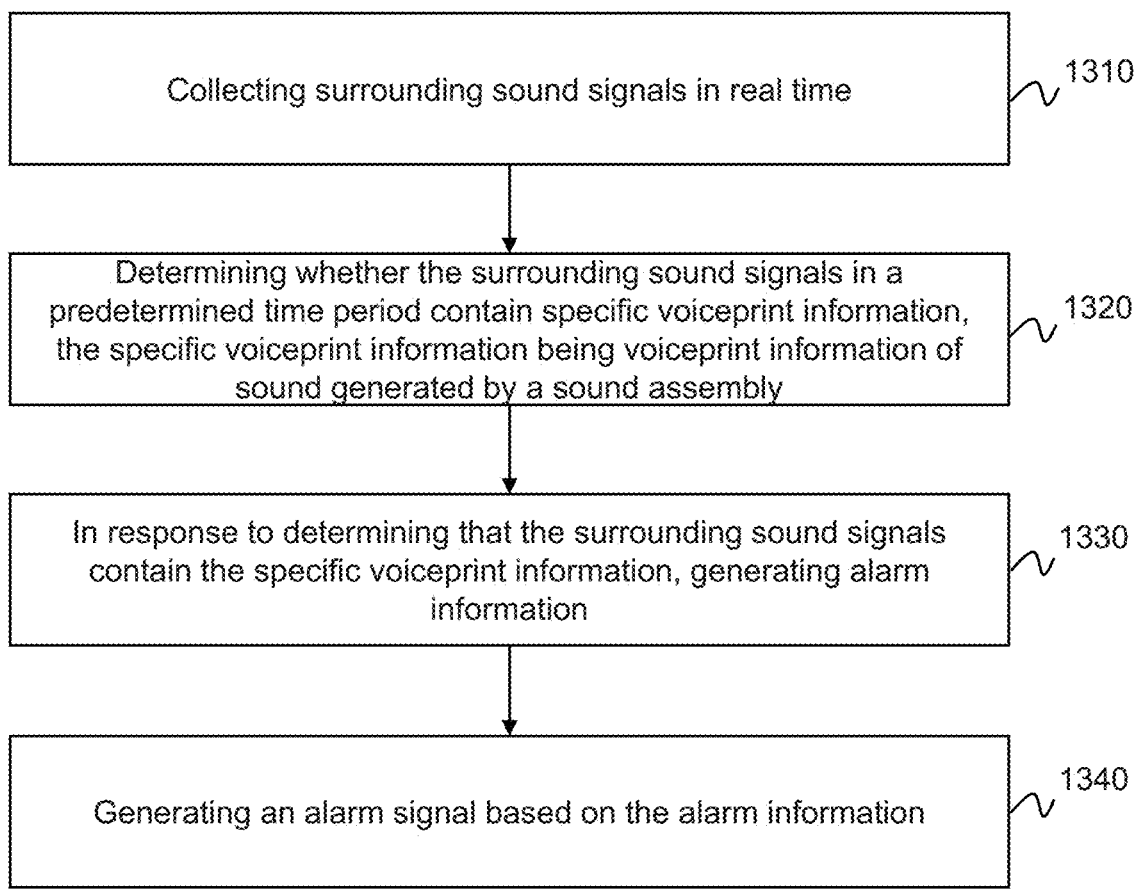
FIG. 13 is a flowchart illustrating an exemplary alarm process according to some embodiments of the present disclosure.

FIG. 13 is a flowchart illustrating an exemplary alarm process according to some embodiments of the present disclosure. In some embodiments, at least part of process 1300 may be performed by the processing device 140 (implemented in, for example, the computing device 300 shown in FIG. 3). For example, the process 1300 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules or assemblies illustrated in FIG. 10 or FIG. 14). The operations of the illustrated process presented below are intended to be illustrative. In some embodiments, the process 1300 may be accomplished with one or more additional operations not described, and/or without one or more of the operations discussed. Additionally, the order in which the operations of the process 1300 is illustrated in FIG. 13 and described below is not intended to be limiting.

In 1310, surrounding sound signals may be collected in real time. In some embodiments, the processing device 140 (e.g., the obtaining module 1410 illustrated in FIG. 14), the alarm device 1000 (e.g., the audio recognition assembly 1020) may preform operation 1310.

As used herein, the surrounding sound signals refer to sound signals in an imaging system (e.g., the imaging system 100), For example, the surrounding sound signals may include sound signals in a scanner (e.g., the MRI scanner 110) of the imaging system. In some embodiments, the surrounding sound signals may be collected via one or more sensors (e.g., a microphone array). For example, as described in connection with FIG. 10, the one or more sensors may be installed in the scanner of the imaging system. When collecting the surrounding sound signals, a direction in which the one or more sensors collects the sound signals may be adjusted, based on information relating to the imaging system (e.g., a position of a table on which a subject may be placed, a position of the subject, a position of an audio generator), to point to an audio generator (e.g., the audio generator 1010 illustrated in FIG. 10). The audio generator may be configured to generate sound with specific voiceprint information.

In 1320, whether the surrounding sound signals in a predetermined time period contain the specific voiceprint information may be determined. In some embodiments, the processing device 140 (e.g., the determination module 1420 illustrated in FIG. 14), the alarm device 1000 (e.g., the audio recognition assembly 1020) may preform operation 1320. As used herein, the predetermined time period refers to a time period of a predetermined duration with the current moment as a time cut-off point. In some embodiments, the predetermined time period may be related to a duration of the sound possibly generated by the audio generator and/or a cycle duration of the noise possibly generated by the imaging system.

In some embodiments, the specific voiceprint information may include feature parameters relating to a specific timbre. Exemplary feature parameters may include a spectrum, a cepstrum, a formant, a fundamental tone, a reflection coefficient of the sound, or the like, or any combination thereof. In some embodiments, the feature parameters relating to the specific timbre may be pre-stored in a storage (e.g., the storage device 150, the storage 1028, etc.) as a recognition template. In some embodiments, to determine whether the surrounding sound signals in the predetermined time period contain the specific voiceprint information, feature parameters may be extracted from the surrounding sound signals in the predetermined time period. Further, the recognition template may be obtained. Whether the surrounding sound signals in the predetermined time period contain the specific voiceprint information may be determined based on the recognition template. For example, the feature parameters extracted from the surrounding sound signals may be compared with the recognition template. If at least part of the feature parameters extracted from the surrounding sound signals are consistent with the recognition template, it may be determined that the surrounding sound signals in the predetermined time period contain the specific voiceprint information.

In some embodiments, whether the surrounding sound signals in the predetermined time period contain the specific voiceprint information may be determined based on a recognition algorithm. Exemplary recognition algorithms may include a template matching algorithm, a nearest neighbor algorithm, a neural network algorithm, a hidden Markov model (HMM) algorithm, a Gaussian mixture model (GMM) algorithm, a vector quantization (VQ) clustering algorithm, a polynomial classifier algorithm, or the like, or any combination thereof. Merely by way of example, the template matching algorithm may include a training stage and a testing stage. In the training stage, sample feature vectors (e.g., feature vectors representing feature parameters) of sample sound signals (e.g., historical sound signals generated by the audio generator) may be extracted. The sample feature vectors may be processed and a sample template database may be generated. The sample template database may include a plurality of sample templates. In the testing stage, testing feature vectors of testing sound signals (e.g., the surrounding sound signals in the predetermined time period) may be extracted. The testing feature vectors may be processed and a testing template may be generated. The testing template may be matched with the plurality of sample templates in the sample template database. The matching result (e.g., a similarity score) may be used for determining whether the surrounding sound signals in the predetermined time period contain the specific voiceprint information. In some embodiments, the template matching algorithm may include a vector quantization (VQ) algorithm, a dynamic time warping (DTW) algorithm, etc. As another example, in the nearest neighbor algorithm, sample feature vectors (e.g., feature vectors representing feature parameters) of sample sound signals (e.g., historical sound signals generated by the audio generator) may be extracted. The sample feature vectors may be stored as training vectors. Then feature vectors of the surrounding sound signals may be extracted and compared with the training vectors based on K nearest neighbors. As a further example, in the neural network algorithm, a trained recognition model may be used to determine whether the surrounding sound signals in the predetermined time period contain the specific voiceprint information. The trained recognition model may be obtained by training a preliminary recognition model using historical surrounding sound signals as a training sample set. The historical surrounding sound signals may include sound signals generated by the sound generator (which may be used as labels) and noises generated by the imaging system. Exemplary neural networks may include a multi-layer perceptron neural network, a radial basis function (RBF) neural network, etc.

In some embodiments, before determining whether the surrounding sound signals in the predetermined time period contain the specific voiceprint information, a noise reduction process may be performed on the surrounding sound signals. For example, the surrounding sound signals may be divided into a plurality of audio frames. For each of the plurality of audio frames, audio features may be extracted from the audio frame. The audio features of an audio frame may include the feature parameters of the audio frame. Further, whether the audio features of an audio frame are the same as or similar to audio features of one or more previous audio frames may be determined. In some embodiments, if audio features of an audio frame are similar to audio features of another audio frame, it may indicate that a ratio of same audio features shared by the two audio frames to the whole features of each audio frame is greater than a threshold value. In response to determining that the audio features are the same as or similar to the audio features of the one or more previous audio frames, the audio frame may be determined as a noise frame. Merely by way of example, a length of the audio frame may be larger than or equal to the duration of the sound generated by the audio generator. The target sound signals may be included in one single frame. In such cases, if the audio features of the audio frame are the same as or similar to the audio features of one previous audio frame, the audio frame may be determined as a noise frame. Then noise frames in the plurality of audio frames may be determined. The noises in the surrounding sound signals may be reduced by removing the noise frames.

As another example, estimated noises (or estimated feature parameters of estimated noises) may be generated using a trained noise estimation model. Further, noises in the surrounding sound signals may be recognized based on the estimated noises. Then the noises may be reduced. In some embodiments, the trained noise estimation model may be obtained by training a preliminary noise estimation model using gradient parameters and historical noises corresponding to the gradient parameters as a training sample set. As used herein, the gradient parameters may include parameters (e.g., an imaging sequence) in an imaging protocol that is used by the imaging system. The historical noises may be generated by the imaging system when imaging the subject based at least on the gradient parameters. The preliminary noise estimation model may be a deep learning model including one or more preliminary model parameters. In the training sample set, each sample may include one set of gradient parameters and a historical noise (which may be used as a label). In some embodiments, the trained noise estimation model may be stored in a memory or a storage device (e.g., the storage device 150) disclosed elsewhere in the present disclosure. Accordingly, the trained noise estimation model may be accessed and used to determine an estimated noise based on a defined set of gradient parameters. For example, an imaging sequence used by the imaging system for imaging the subject in the predetermined time period may be determined. An estimated noise may be generated using the trained noise estimation model based on the imaging sequence. Then noises in the surrounding sound signals in the predetermined time period may be recognized and/or reduced based on the estimated noise. More description of reducing the noise in the surrounding sound signals may be found elsewhere in the present disclosure (e.g., FIG. 18, FIG. 19, and the descriptions thereof).

In 1330, in response to determining that the surrounding sound signals in the predetermined time period contain the specific voiceprint information, alarm information may be generated. In some embodiments, the processing device 140 (e.g., the generation module 1430 illustrated in FIG. 14), the alarm device 1000 (e.g., the audio recognition assembly 1020) may preform operation 1330.

In 1340, an alarm signal may be generated based on the alarm information. In some embodiments, the processing device 140 (e.g., the execution module 1440 illustrated in FIG. 14), the alarm device 1000 (e.g., the alarm 1030) may preform operation 1340, The alarm signal may be in any form, such as a text, an audio, a flashing indicator, or the like, or any combination thereof.

According to the above-mentioned alarm method, an audio generator may be configured to generate sound including specific voiceprint information. An alarm signal may be generated in response to determining that surrounding sound signals in a predetermined time period contain the specific voiceprint information. The audio generator may be provided as a separate device in the scanner of the imaging system, which may solve the problem that the alarm provided by the subject is difficult to be timely detected through an audio intercom when an emergency occurs.

It should be noted that the above description of the process 1300 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, one or more operations of the process 1300 may be added or omitted.

Figure 14:
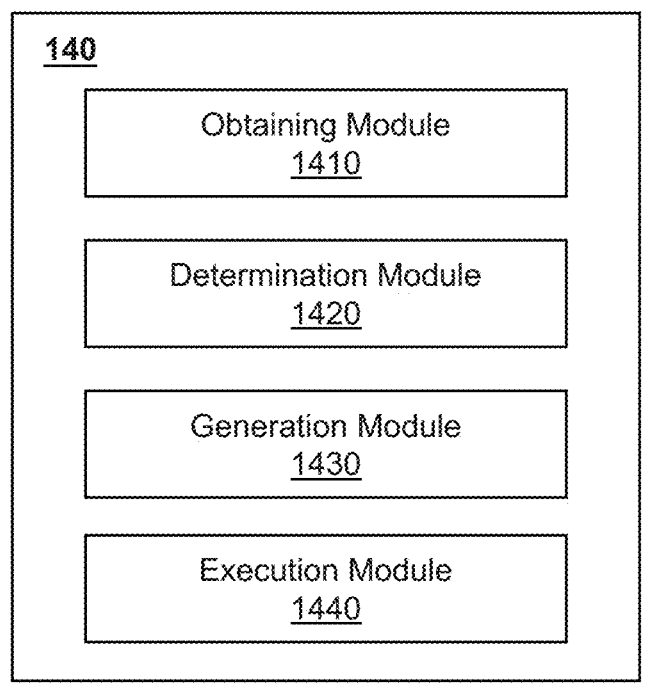
FIG. 14 is a block diagram illustrating an exemplary processing device according to some embodiments of the present disclosure.

FIG. 14 is a block diagram illustrating an exemplary processing device according to some embodiments of the present disclosure. The processing device 140 may include an obtaining module 1410, a determination module 1420, a generation module 1430, and an execution module 1440.

The obtaining module 1410 may be configured to obtain, based on an imaging sequence, noise reduction data from a database. For example, the obtaining module 1410 may be configured to obtain, based on a trigger signal (e.g., a trigger signal generated by the generation module 1430), noise reduction data from the database.

In some embodiments, the obtaining module 1410 may be configured to collect historical first noise generated by an imaging system when imaging a subject based at least on an imaging sequence. For example, the obtaining module 1410 may be configured to collect the historical first noise using one or more sensors. In some embodiments, the obtaining module 1410 may be further configured to obtain parameters relating to the historical first noise.

In some embodiments, the obtaining module 1410 may be configured to collect sound signals in a target time period (e.g., via one or more sensors). In some embodiments, the sound signals may be divided into a plurality of frames. For each of the plurality of frames, the obtaining module 1410 may be configured to extract feature information (e.g., a spectrum, a cepstrum, a formant, a fundamental tone, a reflection coefficient of the sound signal in the frame, etc.) from the frame.

The determination module 1420 may be configured to determine an imaging sequence for imaging a subject. For example, the determination module 1420 may be configured to determine the imaging sequence from a protocol. In some embodiments, the determination module 1420 may be configured to determine an imaging sequence used by an imaging system for imaging a subject in a target time period. The imaging system may generate first noise when imaging the subject based at least on the imaging sequence.

In some embodiments, the determination module 1420 may be configured to determine whether sound signals (e.g., the sound signals collected by the obtaining module 1410) contain target feature information. For example, feature information may be extracted (e.g., by the obtaining module 1410) from the sound signals. The determination module 1420 may be configured to determine whether the feature information extracted from the sound signals contains the target feature information.

In some embodiments, the determination module 1420 may be configured to divide the sound signals into a plurality of frames. Further, for each of the plurality of frames, feature information may be extracted from the frame. Further, for each of the plurality of frames, the determination module 1420 may be configured to determine whether the feature information of a current frame is the same as (or similar to) the feature information of one or more previous frames of the current frame. In response to determining that the feature information is the same as (or similar to) the feature information of the one or more previous frames, the determination module 1420 may be configured to determine the frame as a noise frame.

The generation module 1430 may be configured to generate historical noise reduction data based on parameters relating to a historical first noise. For example, the generation module 1430 may be configured to generate parameters relating to the historical noise reduction data based on the parameters relating to the historical first noise. In some embodiments, the generation module 1430 may be configured further to generate a database based on the historical noise reduction data corresponding to a plurality of imaging sequences. For example, the generation module 1430 may be configured to store the historical noise reduction data corresponding to the plurality of imaging sequences in the database. In some alternative embodiments, the generation module 1430 may be configured further to modify the database based on first modification noises corresponding to the plurality of imaging sequences. For example, for at least one of the plurality of imaging sequences, the generation module 1430 may collect first modification noise generated by the imaging system when imaging the subject based at least on the imaging sequence. Further, parameters relating to the first modification noise may be obtained (e.g., by the obtaining module 1410). Furthermore, the generation module 1430 may generate modification data based on the parameters. Moreover, the generation module 1430 may modify the database based on the modification data corresponding to the at least one of the plurality of imaging sequences.

In some embodiments, the generation module 1430 may be configured to generate a trigger signal based on an imaging sequence. The trigger signal may be used to obtain noise reduction data from a database.

In some embodiments, the generation module 1430 may be configured to generate alarm information in response to determining that the sound signals contain the target feature information.

The execution module 1440 may be configured to cause a generation device to produce a second noise based on the noise reduction data.

In some embodiments, the execution module 1440 may be configured to cause an alarm assembly to generate an alarm signal based on the alarm information.

In some embodiments, the execution module 1440 may be configured to reduce noise in the sound signals based on the noise frame. It should be noted that the above descriptions of the processing device 140 are provided for the purposes of illustration, and not intended to limit the scope of the present disclosure. For persons having ordinary skills in the art, various modifications and changes in the forms and details of the application of the above method and system may occur without departing from the principles of the present disclosure. However, those variations and modifications also fall within the scope of the present disclosure. In some embodiments, the processing device 140 may include one or more other modules. For example, the processing device 140 may include a storage module to store data generated by the modules in the processing device 140.

Figure 15:
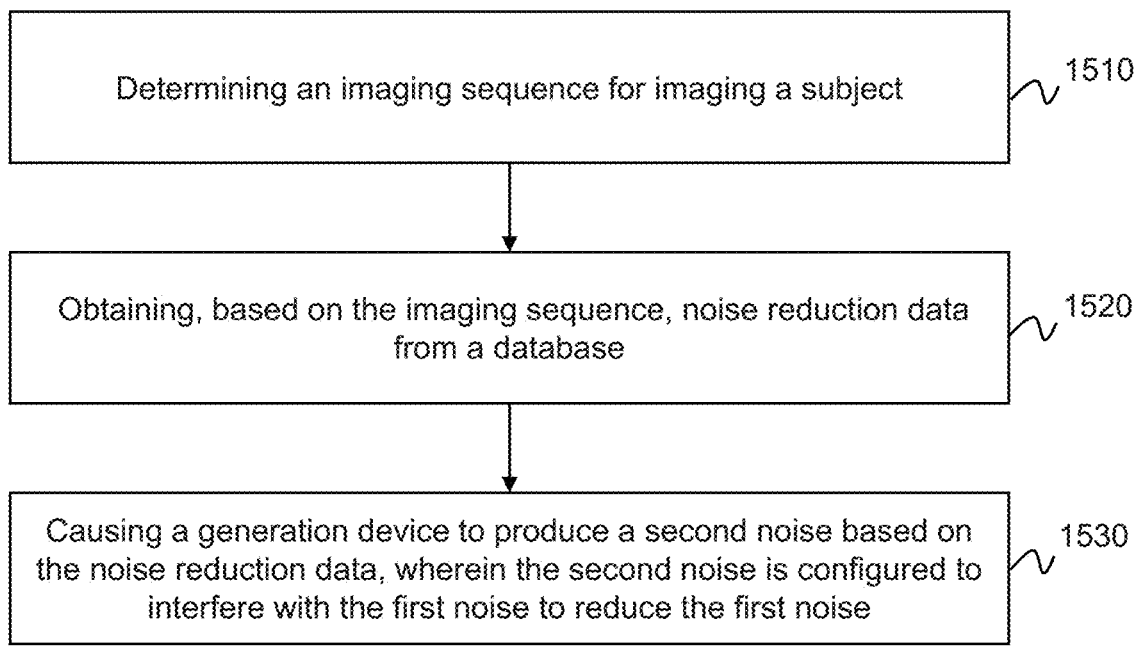
FIG. 15 is a flowchart illustrating an exemplary process for reducing noise according to some embodiments of the present disclosure.

FIG. 15 is a flowchart illustrating an exemplary process for reducing noise according to some embodiments of the present disclosure. In some embodiments, at least part of process 1500 may be performed by the processing device 140 (implemented in, for example, the computing device 300 shown in FIG. 3). For example, the process 1500 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules illustrated in FIG. 14). The operations of the illustrated process presented below are intended to be illustrative. In some embodiments, the process 1500 may be accomplished with one or more additional operations not described, and/or without one or more of the operations discussed. Additionally, the order in which the operations of the process 1500 is illustrated in FIG. 15 and described below is not intended to be limiting.

In 1510, the processing device 140 (e.g., the determination module 1420) may determine an imaging sequence (also referred to as "scanning sequence") for imaging a subject.

In some embodiments, the processing device 140 may determine the imaging sequence from a protocol. The protocol may be designed for a subject to be imaged or treated. For example, an imaging system (e.g., the MRI scanner 110 of the imaging system 100) may image the subject based on an MRI scan protocol. In some embodiments, the protocol may be stored in a storage device (e.g., the storage device 150 of the imaging system 100). In some embodiments, the protocol may include a plurality of imaging sequences with different parameters. Exemplary imaging sequences may include spin echo sequences, gradient echo sequences, diffusion sequences, inversion recovery sequences, or the like, or any combination thereof. Merely by way of example, the spin echo sequences may include a fast spin echo (FSE), a turbo spin echo (TSE), a rapid acquisition with relaxation enhancement (RARE), a half-Fourier acquisition single-shot turbo spin-echo (HASTE), a turbo gradient spin echo (TGSE), or the like, or any combination thereof. In some embodiments, the processing device 140 may determine the imaging sequence before an imaging process of the imaging system. In some embodiments, the processing device 140 may determine the imaging sequence during the imaging process of the imaging system. When imaging the subject based at least on the imaging sequence, the imaging system may generate a first noise.

In 1520, the processing device 140 (e.g., the obtaining module 1410) may obtain, based on the imaging sequence, noise reduction data (also referred to as "anti-phase noise data") from a database (also referred to as "anti-phase noise database"). In some embodiments, to obtain, based on the imaging sequence, noise reduction data from a database, the processing device 140 may generate a trigger signal based on the imaging sequence. The trigger signal may include information related to the imaging sequence. Merely by way of example, the information relating to the imaging sequence may include number information or other information representing the imaging sequence. For illustration purposes, a plurality of imaging sequences may be used by the imaging system for imaging the subject. Each of the plurality of imaging sequences may correspond to a number. When an imaging sequence is determined according to operation 1510, a trigger signal including a number corresponding to the imaging sequence may be generated. In some embodiments, the database may include noise reduction data corresponding to the plurality of imaging sequences. The noise reduction data may be used for reducing the first noise. In some embodiments, the database may further include a plurality of indexes. Each index may correspond to a trigger signal. Further, each index may also be linked to one or more sets of noise reduction data through one or more pointers. In such cases, the trigger signal may be used as a query to retrieve the database. When an index matching the query is retrieved, the one or more sets of noise reduction data pointed to by the index may be obtained. In some embodiments, the database may be generated based on historical first noise corresponding to the plurality of imaging sequences, More description regarding generating the database may be found elsewhere in the present disclosure (e.g., FIG. 16 and the description thereof).

In 1530, the processing device 140 (e.g., the execution module 1440) may cause a generation device to produce a second noise (also referred to as "anti-phase noise") based on the noise reduction data. For example, the processing device 140 may generate an electric signal based on the noise reduction data and transmit the electric signal to the generation device. Further, the generation device may produce the second noise based on the electric signal. In some embodiments, the generation device may include a headset. The headset may be worn by the subject and produce the second noise based on the noise reduction data. In some embodiments, a position of the generation device may be adjustable based at least on a position of the subject in the imaging system. Merely by way of example, the subject may be located inside a scanning channel of a scanner in the imaging system. The generation device may be disposed on an inner wall of the scanning channel and close to the subject's head (or ears). Since the position of the subject in the scanning channel may change in the scanning process, the position of the generation device may be adjustable based on the position of the subject. For example, the generation device may be movably and/or rotatably installed on the inner wall of the scanning channel so as to be adjusted based on the position of the subject's head manually or automatically. In such cases, the generation device may produce the second noise at a position relatively close to the subject's ears, and the second noise may interfere with the first noise transmitted to the user's ears, thereby reducing the first noise effectively. In some embodiments, the second noise may have a phase opposite to a phase of the first noise. In such cases, the second noise may be configured to interfere with the first noise to reduce the first noise.

In some embodiments, parameter values of second noises to be generated by the generation device at different positions relative to the subject's head may be different. For example, for a relatively long distance between the subject's head and the generation device, an amplitude of a second noise to be generated by the generation device may be greater than that for a relatively short distance. In some embodiments, the noise reduction data may be adjustable or selectable based at least on a position of the subject in the imaging system or a position of the generation device. Merely by way of example, for a distance in a certain distance range, a corresponding database including noise reduction data may be generated. When obtaining the noise reduction data based on an imaging sequence, the processing device 140 may determine a distance between the subject's head and the generation device (e.g., based on mechanical parameters of the imaging system). Further, the processing device 140 may determine a database corresponding to the distance between the subject's head and the generation device. Furthermore, the processing device 140 may obtain the noise reduction data from the corresponding database based on the imaging sequence. In such cases, a second noise corresponding to the distance may be generated and transmitted to the subject's head, which may interfere with the first noise transmitted to the user's ears, thereby reducing the first noise effectively. Optionally or additionally, a database may include noise reduction data corresponding to different distances (or distance ranges) and different imaging sequences. The processing device 140 may generate a trigger signal based on the imaging sequence and the distance between the subject's head and the generation device. Further, the processing device may obtain the noise reduction data based on the trigger signal.

It should be noted that the above description of the process 1500 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, one or more operations of the process 1500 may be added or omitted. For example, the process 1500 may include an operation in which the database may be generated and/or an operation in which the database may be modified.

Figure 16:
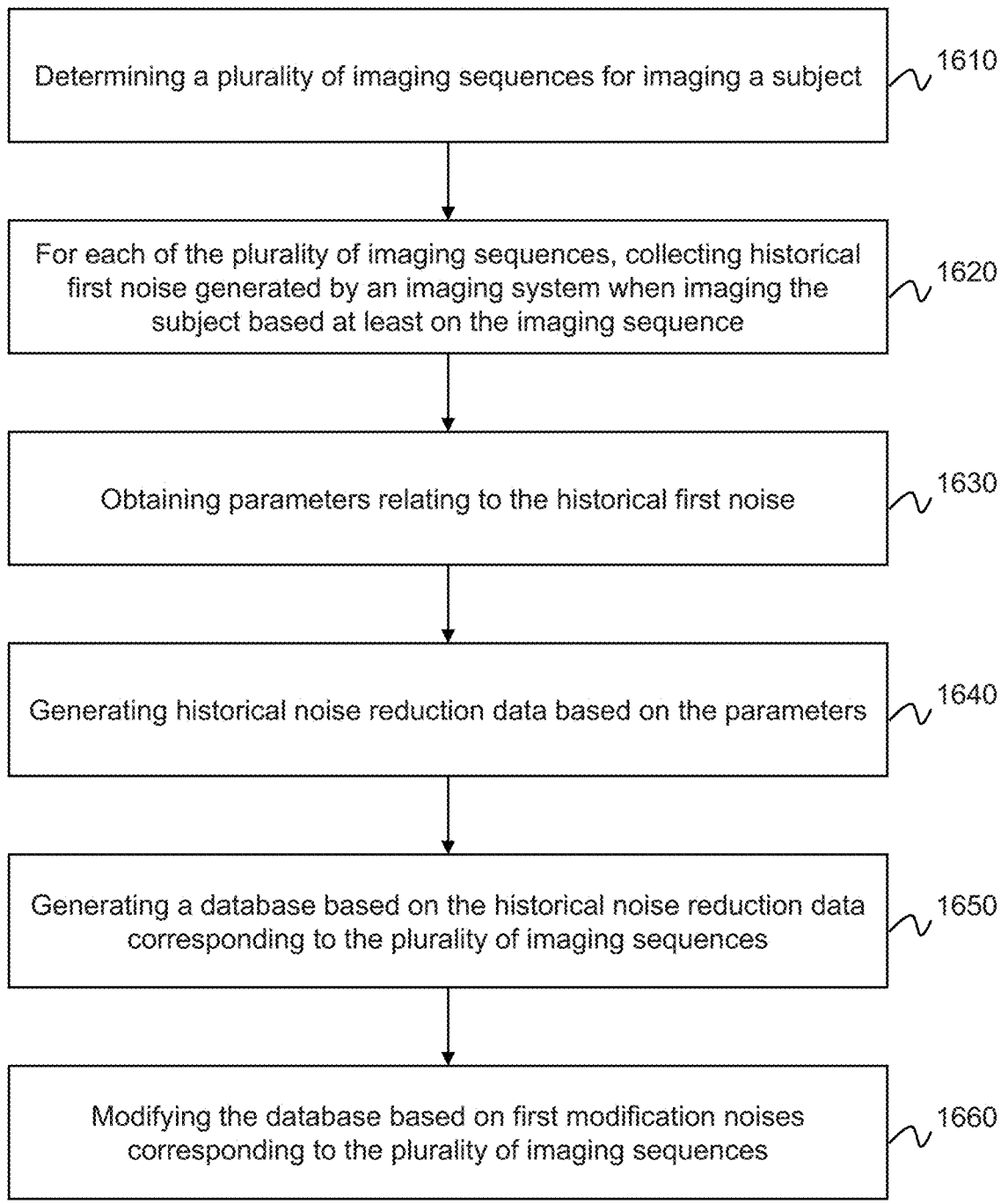
FIG. 16 is a flowchart illustrating an exemplary process for generating a database according to some embodiments of the present disclosure.

FIG. 16 is a flowchart illustrating an exemplary process for generating a database according to some embodiments of the present disclosure. In some embodiments, at least part of process 1600 may be performed by the processing device 140 (implemented in, for example, the computing device 300 shown in FIG. 3). For example, the process 1600 may be stored in a storage device (e.g., the storage device 150, the storage 320, the storage 490) in the form of instructions (e.g.; an application), and invoked and/or executed by the processing device 140 (e.g., the processor 310 illustrated in FIG. 3, the CPU 440 illustrated in FIG. 4, one or more modules illustrated in FIG. 14). The operations of the illustrated process presented below are intended to be illustrative. In some embodiments, the process 1600 may be accomplished with one or more additional operations not described, and/or without one or more of the operations discussed. Additionally, the order in which the operations of the process 1600 is illustrated in FIG. 16 and described below is not intended to be limiting.

In 1610, the processing device 140 (e.g., the determination module 1420) may determine a plurality of imaging sequences for imaging a subject. In some embodiments, the processing device 140 may determine the plurality of imaging sequences from a protocol. In some embodiments, operation 1610 may be performed in a similar manner with operation 1510 as described in connection with FIG. 15, and the descriptions thereof are not repeated here.

In 1620, for each of the plurality of imaging sequences, the processing device 140 (e.g., the obtaining module 1410) may collect historical first noise generated by an imaging system when imaging a subject based at least on the imaging sequence. For example, when the imaging system images the subject based at least on the imaging sequence, the processing device 140 may collect the historical first noise using one or more sensors. The one or more sensors may be installed at one or more positions in the imaging system (e.g., in a scanner, on a housing of the scanner, or other positions in a scanning room in which the imaging system is located). In some embodiments, historical first noises corresponding to the plurality of imaging sequences may be stored in a memory or a storage device (e.g., the storage device 150). The processing device 140 may obtain the historical first noises from the memory or the storage device.

In 1630, the processing device 140 (e.g., the obtaining module 1410) may obtain parameters relating to the historical first noise. In some embodiments, the parameters relating to the historical first noise include a phase, a frequency band, a frequency, an amplitude, a frequency response, energy, a zero crossing rate of the historical first noise, or the like, or any combination thereof. In some embodiments, the processing device 140 may obtain the parameters relating to the historical first noise based on a sound processing algorithm.

In 1640, the processing device 140 (e.g., the generation module 1430) may generate historical noise reduction data (i.e., the noise reduction data) based on the parameters relating to the historical first noise. In some embodiments, the processing device 140 may generate parameters relating to the historical noise reduction data based on the parameters relating to the historical first noise. For example, the parameters relating to the historical noise reduction data may include a phase opposite to the historical first noise, a same frequency band, a same frequency, a same amplitude, a same frequency response, same energy, and a same zero crossing rate as the historical first noise. In such cases, when the imaging system scans a patient using a specific imaging sequence, a second noise generated based on the historical noise reduction data (corresponding to the historical first noise of the specific imaging sequence) may be configured to interfere with the first noise generated by the imaging system using the specific imaging sequence to reduce the first noise.

In 1650, the processing device 140 (e.g., the generation module 1430) may generate the database based on the historical noise reduction data corresponding to the plurality of imaging sequences. In some embodiments, the processing device 140 may store the historical noise reduction data corresponding to the plurality of imaging sequences in the database. In some embodiments, as described in connection with FIG. 5, the plurality of imaging sequences (or trigger signals generated based on the plurality of imaging sequences) may correspond to the historical noise reduction data in a plurality of relationships (a one-to-one relationship, a one-to-many relationship, a many-to-many relationship). Taking an imaging sequence in a one-to-one relationship with one set of historical noise reduction data as an example, the processing device 140 may generate an index corresponding to the imaging sequence in the database. Merely by way of example, the index may be related to a trigger signal generated based on the imaging sequence. The index may be linked to the one set of historical noise reduction data through a pointer. In such cases, the trigger signal may be used as a query to retrieve the database. When an index matching the query is retrieved, the one set of historical noise reduction data pointed to by the index may be obtained.

In 1660, the processing device 140 (e.g., the generation module 1430) may modify the database based on first modification noises corresponding to the plurality of imaging sequences. Specifically, for at least one of the plurality of imaging sequences, the processing device 140 may collect the first modification noise generated by the imaging system when imaging the subject based at least on the imaging sequence. Further, the processing device 140 may obtain parameters relating to the first modification noise, for example, based on a sound processing algorithm. Furthermore, the processing device 140 may generate modification data based on the parameters. In some embodiments, the modification data may include noise reduction data for reducing the first modification noise. For example, the noise reduction data may be used to generate a modification noise having a phase opposite to the first modification noise, a same frequency band, a same frequency, a same amplitude, a same frequency response, same energy, and a same zero crossing rate as the first modification noise. Moreover, the processing device 140 may modify the database based on the modification data corresponding to the at least one of the plurality of imaging sequences. For example, the processing device 140 may obtain (historical) noise reduction data corresponding to the at least one of the plurality of imaging sequences from the database. Further, the processing device 140 may modify the (historical) noise reduction data. For illustration purposes, the processing device 140 may replace the (historical) noise reduction data directly with the modification data.

In some alternative embodiments, when the first modification noise is being collected, a second noise may be simultaneously produced by the generation device based on the noise reduction data in the database. That is, the first modification noise may be a noise after an interference between a first noise generated by the imaging system (when imaging the subject using a specific imaging sequence) and a second noise generated by the speak based on the (historical) noise reduction data (in the database) corresponding to the specific imaging sequence. In such cases, the modification data may be used as compensation data for modifying the noise reduction data. For example, the processing device 140 may modify the noise reduction data using the modification data.

It should be noted that the above description of the process 1600 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, one or more operations of the process 1600 may be added or omitted. For example, the operation 1660 may be omitted.

Figure 17:
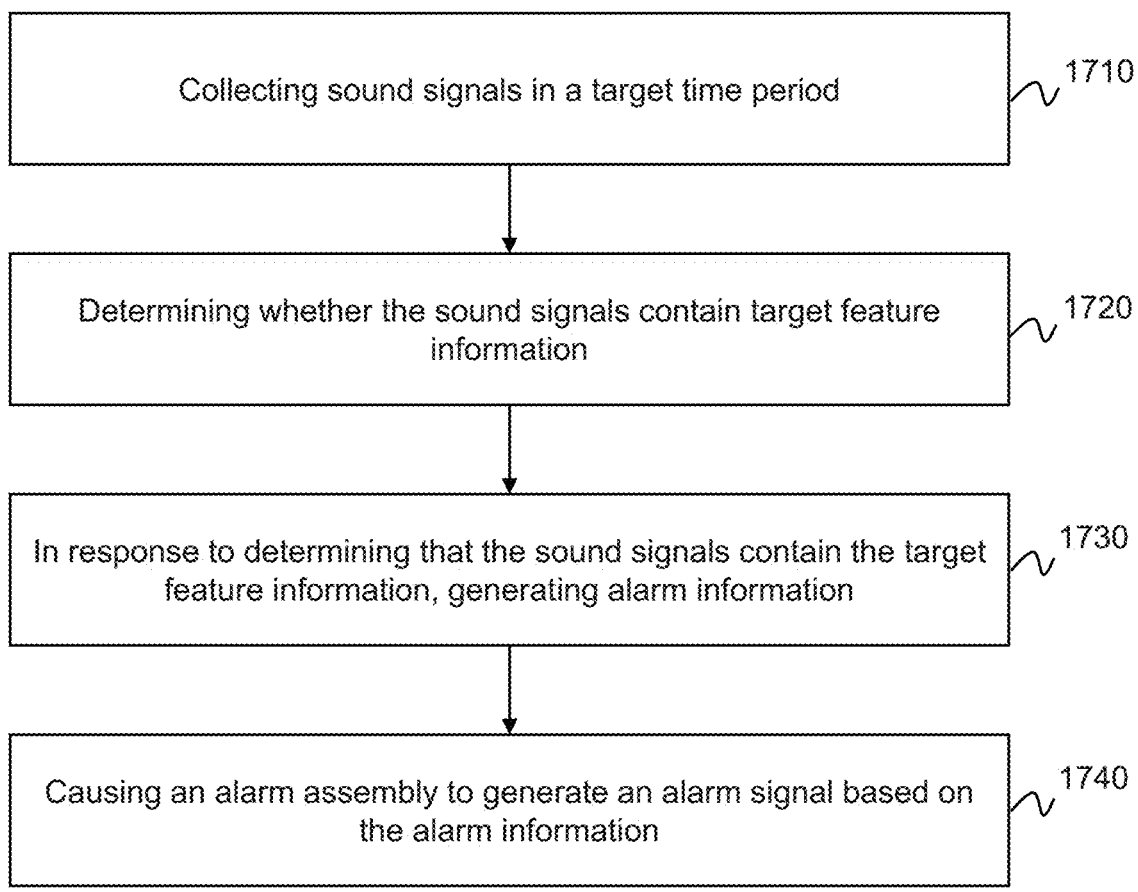
FIG. 17 is a flowchart illustrating an exemplary alarm process according to some embodiments of the present disclosure.

FIG. 17 is a flowchart illustrating an exemplary alarm process according to some embodiments of the present disclosure. In some embodiments, at least part of process 1700 may be performed by the processing device 140 (implemented in, for example, the computing device 300 shown in FIG. 3). For example, the process 1700 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules illustrated in FIG. 14). The operations of the illustrated process presented below are intended to be illustrative. In some embodiments, the process 1700 may be accomplished with one or more additional operations not described, and/or without one or more of the operations discussed. Additionally, the order in which the operations of the process 1700 is illustrated in FIG. 17 and described below is not intended to be limiting.

In 1710, the processing device 140 (e.g., the obtaining module 1410) may collect sound signals in a target time period. As used herein, the sound signals refer to sound signals relating to an imaging system (e.g., the imaging system 100). For example, the sound signals may include sound signals in a scanner (e.g., the MRI scanner 110) of the imaging system.

In some embodiments, the sound signals may be collected via one or more sensors. For example, the one or more sensors may be fixedly or removably installed in the scanner of the imaging system. A sound assembly (also referred to as "audio generator") configured to generate target sound signals including target feature information (also referred to as "specific voiceprint information") may be provided in the imaging system. Optionally, when collecting the sound signals, the processing device 140 may adjust, based on information relating to the imaging system (e.g., a position of a table on which a subject may be placed, a position of the subject, a position of the sound assembly), a direction in which the one or more sensors collects the sound signals to point to the sound assembly.

In some embodiments, as described in connection with Fla 10, the target time period (also referred to as "predetermined time period") may be related to a duration of the target sound signals possibly generated by the sound assembly and/or a cycle duration of sound signals possibly generated by the imaging system. For example, the predetermined time period may be longer than the duration of the sound generated by the audio generator 1010. As another example, the predetermined time period may be shorter than the cycle duration of the noise generated by the imaging system.

In some embodiments, sound signals relating to the imaging system may be collected by the one or more sensors in real time. Further, the sound signals relating to the imaging system may be stored in a storage device. The processing device 140 may obtain the sound signals in the target time period from the storage device. In some embodiments, the processing device 140 may cause the one or more sensors to collect the sound signals relating to the imaging system in the target time period. Further, the processing device 140 may obtain the sound signals in the target time period from the one or more sensors directly.

In 1720, the processing device 140 (e.g., the determination module 1420) may determine whether the sound signals contain the target feature information. In some embodiments, to determine whether the sound signals contain the target feature information, the processing device 140 may extract feature information from the sound signals. For example, the processing device 140 may extract feature information from the sound signals based on a sound processing algorithm. Exemplary feature information may include a spectrum, a cepstrum, a formant, a fundamental tone, a reflection coefficient of the sound signals, or the like, or any combination thereof. Further, the processing device 140 may determine whether the feature information contains the target feature information. For example, as described above, the sound assembly may be configured to generate target sound signals including the target feature information. In some embodiments, the target feature information may be stored in a storage device (e.g., the storage device 150, the storage 1028, etc.) as a recognition template. The processing device 140 may compare the feature information extracted from the sound signals with the recognition template. If at least part of the feature information extracted from the sound signals is consistent with the recognition template, the processing device 140 may determine that the feature information contains the target feature information.

In some embodiments, the processing device 140 may determine whether the feature information contains the target feature information based on a recognition algorithm. Exemplary recognition algorithms may include a template matching algorithm, a nearest neighbor algorithm, a neural network algorithm, a hidden Markov model (HMM) algorithm, a Gaussian mixture model (GMM) algorithm, a vector quantization (VQ) clustering algorithm, a polynomial classifier algorithm, or the like, or any combination thereof.

In some alternative embodiments, to better detect the target feature information in the sound signals, the processing device 140 may first reduce noise in the sound signals, and then determine whether the sound signals contain the target feature information. For example, the processing device 140 may divide the sound signals into a plurality of frames (also referred to as "audio frame"). Further, the processing device 140 may determine noise frames in the plurality of frames. More description of reducing the noise in the sound signals based on the plurality of frames may be found elsewhere in the present disclosure (e.g., FIG. 18, and the description thereof). As another example, as described in connection with FIG. 13, estimated noises may be generated using a trained noise estimation model. Further, the processing device 140 may recognize and/or reduce noises in the sound signals based on the estimated noises. As a further example, the processing device 140 may reduce the noise in the sound signals based on noise reduction data in a database. More description of reducing the noise in the sound signals based on noise reduction data in a database may be found elsewhere in the present disclosure (e.g., FIG. 19, and the description thereof).

In 1730, in response to determining that the sound signals contain the target feature information, the processing device 140 (e.g., the generation module 1430) may generate alarm information.

In 1740, the processing device 140 (e.g., the execution module 1440) may cause an alarm assembly to generate an alarm signal based on the alarm information. The alarm signal may be in any form, such as a text, an audio, a flashing indicator, or the like, or any combination thereof.

It should be noted that the above description of the process 1700 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, one or more operations of the process 1700 may be added or omitted. For example, a division operation may be added in the process 1700. In the division operation, the sound signals collected in the target time period may be divided into a plurality of frames. Operations (e.g., operations 1720-1740) in the process 1700 may be performed based on the plurality of frames.

Figure 18:
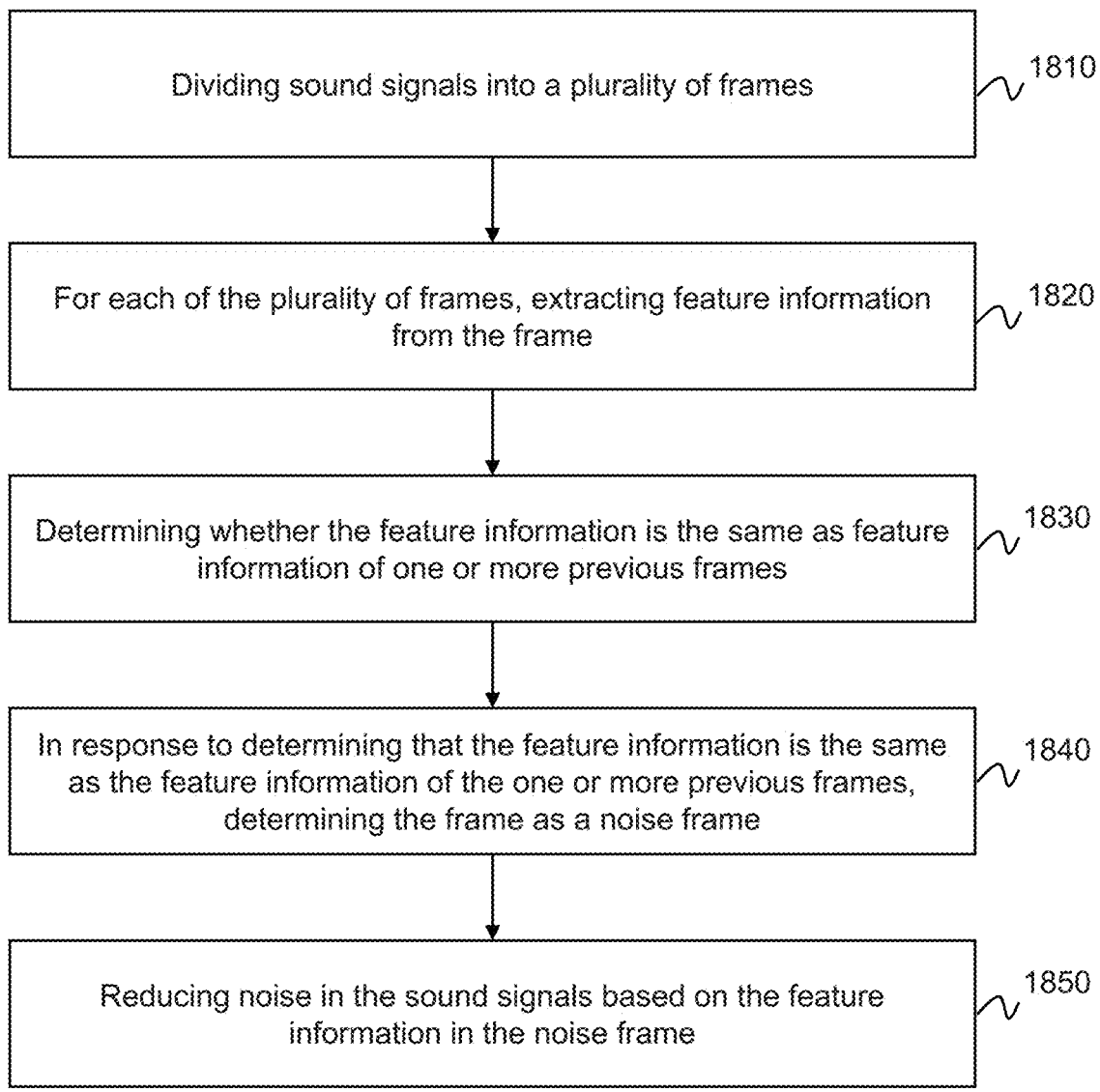
FIG. 18 is a flowchart illustrating an exemplary process for reducing noise in sound signals according to some embodiments of the present disclosure.

FIG. 18 is a flowchart illustrating an exemplary process for reducing noise in sound signals according to some embodiments of the present disclosure. In some embodiments, at least part of process 1800 may be performed by the processing device 140 (implemented in, for example, the computing device 300 shown in FIG. 3). For example, the process 1800 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules illustrated in FIG. 14). The operations of the illustrated process presented below are intended to be illustrative. In some embodiments, the process 1800 may be accomplished with one or more additional operations not described, and/or without one or more of the operations discussed. Additionally, the order in which the operations of the process 1800 is illustrated in FIG. 18 and described below is not intended to be limiting.

In 1810, the processing device 140 (e.g., the determination module 1420) may divide the sound signals into a plurality of frames. In some embodiments, the processing device 140 may divide the sound signals into a plurality of segments, Each segment may be a regarded as a frame. For example, the processing device 140 may divide the sound signals into the plurality of segments evenly. Each segment may have a same time length. For illustration purposes, the time length may be 5-50 ms, Optionally or additionally, the sound signal in each frame may be relatively stable (e.g., in frequency and/or amplitude).

In 1820, for each of the plurality of frames, the processing device 140 (e.g., the obtaining module 1410) may extract the feature information from the frame. For example, the processing device 140 may extract feature information from the frame based on a sound processing algorithm. Exemplary feature information may include a spectrum, a cepstrum, a formant, a fundamental tone, a reflection coefficient of the sound signal in the frame, or the like, or any combination thereof.

In 1830, the processing device 140 (e.g., the determination module 1420) may determine whether the feature information of a current frame is the same as (or similar to) the feature information of one or more previous frames of the current frame. In some embodiments, a count of the previous frames may be related to the time length of each frame and/or a duration of the target sound signals possibly generated by a sound assembly (e.g., the audio generator 1010 illustrated in FIG. 10). Merely by way of example, if the time length of each frame is larger than or equal to the duration of the target sound signals, the target sound signals may be included in one single frame. In such cases, the processing device 140 may determine whether the feature information of the current frame is the same as (or similar to) the feature information of one previous frame. As another example, if the time length of each frame is less than the duration of the target sound signals, the target sound signals may be distributed in two or more frames. For illustration purposes, if the time length of each frame is half of the duration of the target sound signals, the processing device 140 may determine whether the feature information of the current frame is the same as (or similar to) the feature information of three or more previous frames.

In 1840, in response to determining that the feature information is the same as (or similar to) the feature information of the one or more previous frames, the processing device 140 (e.g., the determination module 1420) may determine the frame as a noise frame. It is noted that if the target sound signals are included in a current frame, the current frame may be different from other frames. In contrast, if the feature information of the current frame is the same as (or similar to) the feature information of the one or more previous frames, the processing device 140 may determine the current frame as a noise frame.

In 1850, the processing device 140 (e.g., the execution module 1440) may reduce noise in the sound signals based on the noise frame. For example, the processing device 140 may remove the noise frame directly from the plurality of frames. Then the processing device 140 may determine whether the sound signals contain target feature information based on other frames remained in the plurality of frames.

It should be noted that the above description of the process 1800 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, one or more operations of the process 1800 may be added or omitted.

Figure 19:
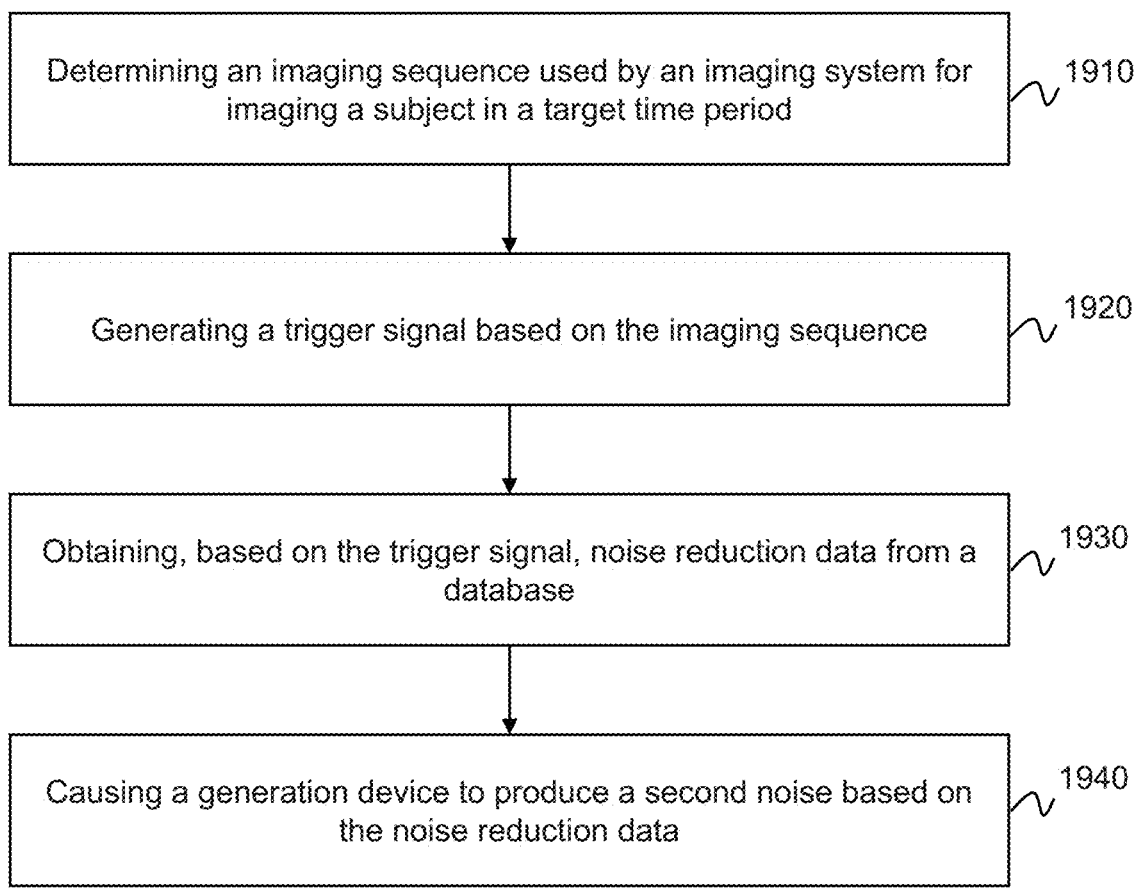
FIG. 19 is a flowchart illustrating another exemplary process for reducing noise in sound signals according to some embodiments of the present disclosure.

FIG. 19 is a flowchart illustrating another exemplary process for reducing noise in sound signals according to some embodiments of the present disclosure. In some embodiments, at least part of process 1900 may be performed by the processing device 140 (implemented in, for example, the computing device 300 shown in FIG. 3). For example, the process 1900 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules illustrated in FIG. 14). The operations of the illustrated process presented below are intended to be illustrative. In some embodiments, the process 1900 may be accomplished with one or more additional operations not described, and/or without one or more of the operations discussed. Additionally, the order in which the operations of the process 1900 is illustrated in FIG. 19 and described below is not intended to be limiting.

In 1910, the processing device 140 (e.g., the determination module 1420) may determine an imaging sequence used by an imaging system for imaging a subject in the target time period. In some embodiments, the imaging system (e.g. the imaging system 100 illustrated in FIG. 1) may generate first noise when imaging the subject based at least on the imaging sequence. In some embodiments, the processing device 140 may determine the imaging sequence from a protocol. In some embodiments, operation 1910 may be performed in a similar manner with operation 1510 as described in connection with FIG. 15, and the descriptions thereof are not repeated here.

In 1920, the processing device 140 (e.g., the generation module 1430) may generate a trigger signal based on the imaging sequence. The trigger signal may include information related to the imaging sequence. Merely by way of example, as illustrated in connection with operation 1520 in FIG. 15, the information relating to the imaging sequence may include number information or other information representing the imaging sequence. For illustration purposes, a plurality of imaging sequences may be used by the imaging system for imaging the subject. Each of the plurality of imaging sequences may correspond to a number. When an imaging sequence is determined according to operation 1910, a trigger signal including a number corresponding to the imaging sequence may be generated.

In 1930, the processing device 140 (e.g., the obtaining module 1410) may obtain, based on the trigger signal, noise reduction data from a database.

In some embodiments, the database may include noise reduction data corresponding to a plurality of imaging sequences. The noise reduction data may be used for reducing the first noise. In some embodiments, the database may further include a plurality of indexes. Each index may correspond to a trigger signal. Further, the each index may also be linked to one or more sets of noise reduction data through one or more pointers. In such cases, the processing device 140 may retrieve the database with the trigger signal as a query. When an index matching the query is retrieved, the processing device 140 may obtain the one or more sets of noise reduction data pointed to by the index. In some embodiments, the database may be generated based on historical first noise corresponding to the plurality of imaging sequences. More description regarding generating the database may be found elsewhere in the present disclosure (e.g., FIG. 16 and the description thereof).

In 1940, the processing device 140 (e.g., the execution module 1440) may cause a generation device to produce a second noise based on the noise reduction data. For example, the processing device 140 may generate an electric signal based on the noise reduction data and transmit the electric signal to the generation device. Further, the generation device may produce the second noise based on the electric signal. In some embodiments, the processing device 140 may cause the generation device to produce the second noise at the same time as the imaging system generates the first noise. Then the second noise may interfere with the first noise to reduce the first noise.

According to the noise reduction method illustrated in the process 1900, noise reduction data may be used to reduce a first noise generated by an imaging system. In some embodiments, the noise reduction method may be used in an alarm process (e.g., the process 1700 illustrated in FIG. 17) to reduce a noise (e.g., a first noise generated by the imaging system when imaging the subject based at least on an imaging sequence) in sound signals relating to the imaging system. For example, the process 1900 may be performed before the operation 1710. Then the sound signals collected in 1710 may include the first noise, the second noise, and/or possibly the target sound signals. In the sound signals, the first noise may be reduced by the second noise. In such cases, target feature information in the sound signals may be better detected.

It should be noted that the above description of the process 1900 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, one or more operations of the process 1900 may be added or omitted. In some embodiments, one or more operations of the process 1900 may be added or omitted. For example, the process 1900 may include an operation in which the database may be generated and/or an operation in which the database may be modified.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable medium having computer readable program code embodied thereon.

A computer readable signal medium may include a propagated data signal with computer readable program code embodied therein, for example, in baseband or as part of a carder wave. Such a propagated signal may take any of a variety of forms, including electromagnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RE, or the like, or any suitable combination of the foregoing.

Computer program code for carrying out operations for aspects of the present disclosure may be written in any combination of one or more programming languages, including a subject-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof to streamline the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application, Thus, by way of example, but not of limitation, alternative configurations of the embodiments of the application may be utilized in accordance with the teachings herein. Accordingly, embodiments of the present application are not limited to that precisely as shown and described.

We claim:

1. A method for reducing noise in an imaging system, implemented on a computing device having at least one storage device storing a set of instructions, and at least one processor in communication with the at least one storage device, the method comprising:
   determining an imaging sequence for imaging a subject, wherein when imaging the subject based at least on the imaging sequence, the imaging system generates a first noise;
   obtaining, based on the imaging sequence, noise reduction data from a database; and
   causing a generation device to produce a second noise based on the noise reduction data, wherein the second noise is configured to interfere with the first noise to reduce the first noise.

2. The method of claim 1, wherein the obtaining, based on the imaging sequence, noise reduction data from a database comprising:
   generating a trigger signal based on the imaging sequence.

3. The method of claim 1, wherein the database is generated based on historical first noise corresponding to a plurality of imaging sequences.

4. The method of claim 3, wherein to generate the database, the method further includes:
   for each of the plurality of imaging sequences,
   collecting the historical first noise generated by the imaging system when imaging the subject based at least on the imaging sequence;
   obtaining parameters relating to the historical first noise; and
   generating historical noise reduction data based on the parameters; and
   generating the database based on the historical noise reduction data corresponding to the plurality of imaging sequences.

5. The method of claim 3, further comprising modifying the database based on first modification noises corresponding to the plurality of imaging sequences.

6. The method of claim 5, wherein the modifying the database based on the first modification noise corresponding to the plurality of imaging sequences includes:

for at least one of the plurality of imaging sequences,
collecting the first modification noise generated by the imaging system when imaging the subject based at least on the imaging sequence;
obtaining parameters relating to the first modification noise; and
generating modification data based on the parameters, wherein the modification data includes noise reduction data for reducing the first modification noise; and
modifying the database based on the modification data corresponding to the at least one of the plurality of imaging sequences.

7. The method of claim 1, wherein the at least one processor includes a field programmable gate array or an advanced RISC machine, a clock of the field programmable gate array or the advanced RISC machine being configured to generate a clock signal with a frequency different from an operating frequency of the imaging system.

8. The method of claim 1, wherein the generation device includes a headset.

9. The method of claim 1, wherein a position of the generation device is adjustable based at least on a position of the subject in the imaging system.

10. The method of claim 1, wherein the noise reduction data is adjustable based at least on a position of the subject in the imaging system or a position of the generation device.

11. The method of claim 1, wherein the noise reduction data is anti-phase noise data used to reduce the first noise.

12. The method of claim 1, wherein the second noise has a phase opposite to a phase of the first noise.

13. The method of claim 1, wherein the second noise has a same frequency as the first noise.

14. The method of claim 1, wherein the causing a generation device to produce the second noise based on the noise reduction data includes:

generating an electric signal based on the noise reduction data;
transmitting the electric signal to the generation device; and
causing the generation device to produce the second noise based on the electric signal.

15. The method of claim 2, wherein the trigger signal is used as a query to retrieve the database.

16. The method of claim 2, wherein the trigger signal is generated based on the imaging sequence and a distance between the subject's head and the generation device.

17. The method of claim 6, wherein the modification data is used to generate a modification noise having a phase opposite to the first modification noise, the modification noise having a same frequency band, a same frequency, a same amplitude, a same frequency response, same energy, and a same zero crossing rate as the first modification noise.

18. The method of claim 6, wherein when the first modification noise is being collected, the second noise is simultaneously produced by the generation device based on the noise reduction data in the database.

19. The method of claim 6, wherein the first modification noise is a noise after an interference between the first noise and the second noise.

20. A system for reducing noise in an imaging system, comprising:

at least one storage medium including a set of instructions; and
at least one processor in communication with the at least one storage medium, wherein when executing the set of instructions, the at least one processor is directed to cause the system to perform operations including:
determining an imaging sequence for imaging a subject, wherein when imaging the subject based at least on the imaging sequence, the imaging system generates a first noise;
obtaining, based on the imaging sequence, noise reduction data from a database; and
causing a generation device to produce a second noise based on the noise reduction data, wherein the second noise is configured to interfere with the first noise to reduce the first noise.

* * * * *